(12) United States Patent
Choi et al.

(10) Patent No.: US 12,464,873 B2
(45) Date of Patent: Nov. 4, 2025

(54) DISPLAY DEVICE, METHOD OF FABRICATING THE SAME, AND TILED DISPLAY DEVICE INCLUDING A PLURALITY OF DISPLAY DEVICES

(71) Applicant: Samsung Display Co., LTD., Yongin-si (KR)

(72) Inventors: Nak Cho Choi, Yongin-si (KR); Sang Woo An, Asan-si (KR); Yong Duck Son, Seongnam-si (KR); Won Ho Jang, Hwaseong-si (KR); Myung Koo Hur, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

(21) Appl. No.: 17/970,406

(22) Filed: Oct. 20, 2022

(65) Prior Publication Data

US 2023/0238494 A1 Jul. 27, 2023

(30) Foreign Application Priority Data

Jan. 27, 2022 (KR) ........................ 10-2022-0012657

(51) Int. Cl.
  *H10H 20/857* (2025.01)
  *G09F 9/302* (2006.01)
  (Continued)

(52) U.S. Cl.
  CPC ......... *H10H 20/857* (2025.01); *G09F 9/3026* (2013.01); *G09F 9/33* (2013.01); *H01L 25/0753* (2013.01); *H10H 20/0364* (2025.01)

(58) Field of Classification Search
  CPC .............. H01L 25/075; H10H 20/0364; H10H 20/857; H10K 59/1315; G09F 9/335;
  (Continued)

(56) References Cited

U.S. PATENT DOCUMENTS

| 11,056,630 B2* | 7/2021 | Hong ..................... H10H 29/49 |
| 2020/0259056 A1* | 8/2020 | Hong .................... H01L 25/167 |

(Continued)

FOREIGN PATENT DOCUMENTS

| CN | 116367644 A | 6/2023 |
| JP | 7034235 B2 | 3/2022 |

(Continued)

*Primary Examiner* — Victor A Mandala
(74) *Attorney, Agent, or Firm* — Womble Bond Dickinson (US) LLP

(57) ABSTRACT

A display device includes a substrate including a first surface, a second surface opposite the first surface, a first chamfered surface extending from a side of the first surface, a second chamfered surface extending from a side of the second surface, and a first side surface connecting the first chamfered surface and the second chamfered surface, a plurality of subpixels on the first surface, a side wiring on the first surface, the first chamfered surface, the first side surface, the second chamfered surface, and the second surface of the substrate, and a circuit board on the second surface. The side wiring comprises a first portion on the first surface and a second portion on the first side surface, and includes metal particles where a packing density of the metal particles in the first portion is higher than a packing density of the metal particles in the second portion.

9 Claims, 28 Drawing Sheets

(51) Int. Cl.
*G09F 9/33* (2006.01)
*H01L 25/075* (2006.01)
*H10H 20/01* (2025.01)

(58) Field of Classification Search
CPC ........ G09F 9/3023; G09F 9/3026; G09F 9/33; H10D 86/021; H10D 86/441
See application file for complete search history.

(56) References Cited

U.S. PATENT DOCUMENTS

| | | | |
|---|---|---|---|
| 2022/0052080 A1* | 2/2022 | Kim | H01L 25/167 |
| 2023/0005962 A1* | 1/2023 | Lee | H01L 25/0753 |
| 2023/0207318 A1 | 6/2023 | Choi et al. | |
| 2023/0207577 A1 | 6/2023 | Kim | |
| 2023/0238399 A1* | 7/2023 | Choi | H10D 86/60 |
| 2023/0238495 A1* | 7/2023 | Choi | H01L 25/0753 |
| | | | 257/79 |
| 2023/0268474 A1* | 8/2023 | Jeong | H10D 86/60 |
| | | | 257/79 |
| 2023/0335700 A1* | 10/2023 | Hsu | H10H 20/857 |
| 2024/0038953 A1* | 2/2024 | Nakamitsu | H10H 20/857 |
| 2024/0170497 A1* | 5/2024 | Gong | H10H 29/10 |

FOREIGN PATENT DOCUMENTS

| | | |
|---|---|---|
| KR | 10-2019-0044016 A | 4/2019 |
| KR | 10-2021-0061957 A | 5/2021 |
| KR | 10-2021-0085596 A | 7/2021 |
| KR | 10-2344277 B1 | 12/2021 |
| KR | 2023-0097279 A | 7/2023 |
| KR | 2023-0100763 A | 7/2023 |

\* cited by examiner

FIG. 2
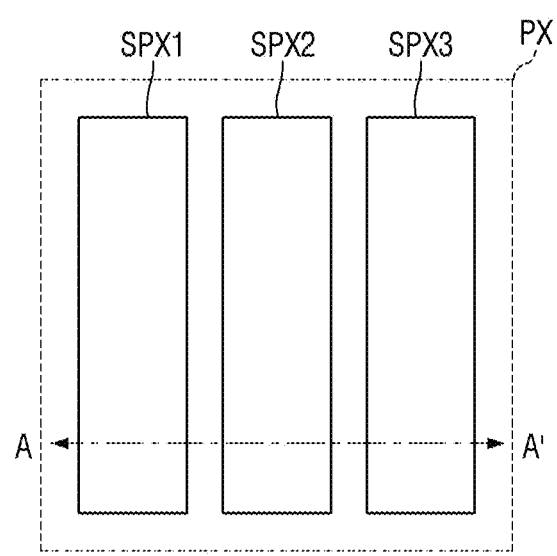
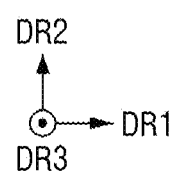

FIG. 19B
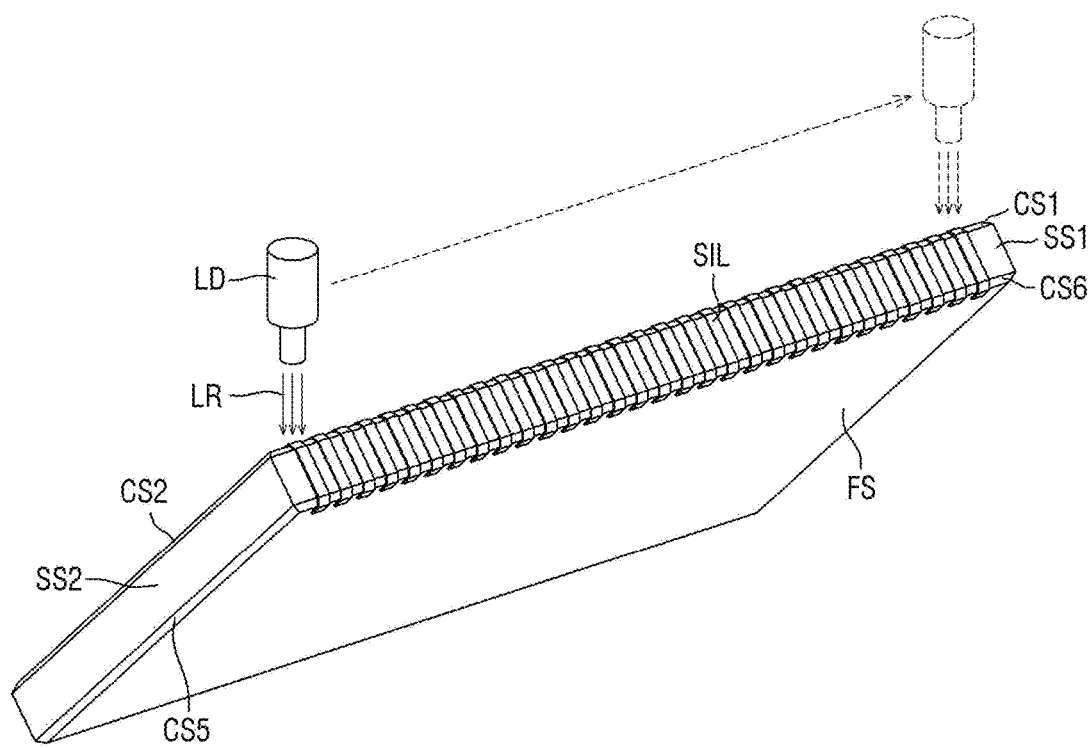
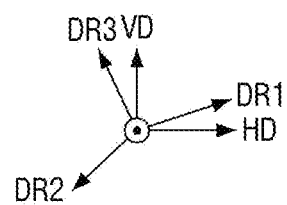

DISPLAY DEVICE, METHOD OF FABRICATING THE SAME, AND TILED DISPLAY DEVICE INCLUDING A PLURALITY OF DISPLAY DEVICES

CROSS-REFERENCE TO RELATED APPLICATION

This application claims priority to and the benefit of Korean Patent Application No. 10-2022-0012657 filed on Jan. 27, 2022 in the Korean Intellectual Property Office (KIPO), the entire content of which is incorporated by reference herein.

BACKGROUND

1. Field

One or more embodiments of the present disclosure relate to a display device, a method of fabricating the same, and a tiled display device including a plurality of display devices.

2. Description of the Related Art

As the information society develops, demands for display devices for displaying images are increasing in various forms. The display devices may be flat panel displays such as liquid crystal displays, field emission displays, and/or light emitting displays. The light emitting displays may include an organic light emitting display including an organic light emitting diode element as a light emitting element and a light emitting diode display including an inorganic light emitting diode element such as a light emitting diode (LED) as a light emitting element.

A display device includes a display area in which pixels displaying an image are provided and a non-display area (or bezel area) which is provided around the display area and in which wirings for driving the pixels are positioned. Recently, a bezel-less display device (e.g., a display device without a bezel) has been released to maximize or improve the display area. Accordingly, there is an increasing demand or desire for a display device in which wirings are formed on a side surface of a substrate to reduce the non-display area or completely eliminate the non-display area.

SUMMARY

Aspects and features of embodiments of the present disclosure provide a display device capable of reducing resistivity of side wirings.

Aspects and features of embodiments of the present disclosure provide a method of fabricating the display device capable of reducing resistivity of side wirings.

Aspects and features of embodiments of the present disclosure provide a tiled display device including a plurality of display devices capable of reducing resistivity of side wirings.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate including a first surface, a second surface opposite the first surface, a first chamfered surface extending from a side of the first surface, a second chamfered surface extending from a side of the second surface, and a first side surface connecting the first chamfered surface and the second chamfered surface, a plurality of subpixels on the first surface of the substrate and respectively including inorganic light emitting elements configured to emit light, a side wiring on the first surface, the first chamfered surface, the first side surface, the second chamfered surface, and the second surface of the substrate, and a circuit board on the second surface of the substrate and electrically connected to the side wiring. The side wiring includes metal particles and comprises a first portion on the first surface of the substrate and a second portion on the first side surface of the substrate, and a packing density of the metal particles of the first portion is higher than a packing density of the metal particles of the second portion.

The side wiring may further include a third portion on the first chamfered surface of the substrate, and the packing density of the metal particles of the first portion is higher than a packing density of the metal particles of the third portion.

The packing density of the metal particles of the second portion may be higher than the packing density of the metal particles of the third portion.

The side wiring may further include a fourth portion on the second surface of the substrate, and a packing density of the metal particles of the fourth portion may be higher than the packing density of the metal particles of the second portion.

The side wiring may further include a fifth portion on the second chamfered surface of the substrate, and the packing density of the metal particles of the fourth portion may be higher than a packing density of the metal particles of the fifth portion.

The packing density of the metal particles of the second portion may be higher than the packing density of the metal particles of the fifth portion.

The side wiring may further include a third portion on the first chamfered surface of the substrate, and a thickness of the first portion of the side wiring may be greater than a thickness of the third portion of the side wiring.

A thickness of the second portion of the side wiring may be greater than the thickness of the third portion of the side wiring.

According to an aspect of the present disclosure, there is provided a method of fabricating a display device, the method including forming a plurality of side wirings on a first surface of a substrate, a second surface of the substrate facing the first surface, a first chamfered surface of the substrate extending from a side of the first surface, a second chamfered surface of the substrate extending from a side of the second surface, and a first side surface of the substrate connecting the first chamfered surface and the second chamfered surface, the plurality of side wirings connecting first pads provided on the first surface of the substrate to second pads provided on the second surface of the substrate, respectively, irradiating a laser to a first portion of a first side wiring provided on the second surface of the substrate among the plurality of side wirings, irradiating the laser to a second portion of the first side wiring provided on the first side surface of the substrate, and irradiating the laser to a third portion of the first side wiring provided on the first surface of the substrate.

The irradiating of the laser to the first portion of the first side wiring on the second surface of the substrate may include irradiating the laser while moving from one side of a first sub-area of the first portion to another side of the first sub-area of the first portion, and irradiating the laser while moving from one side of a second sub-area of the first portion to another side of the second sub-area of the first portion.

The first sub-area of the first portion may overlap the second sub-area of the first portion.

The irradiating of the laser to the second portion of the first side wiring provided on the first side surface of the substrate may include irradiating the laser while moving from one side of a first sub-area of the second portion to another side of the first sub-area of the second portion, and irradiating the laser while moving from one side of a second sub-area of the second portion to another side of the second sub-area of the second portion.

The first sub-area of the second portion and the second sub-area of the second portion may overlap.

An overlap ratio of the first sub-area of the first portion and the second sub-area of the first portion may be higher than an overlap ratio of the first sub-area of the second portion and the second sub-area of the second portion.

A moving direction of the laser in the first sub-area of the first portion and the second sub-area of the first portion may be a first direction, and a moving direction of the laser in the first sub-area of the second portion and the second sub-area of the second portion may be a second direction intersecting the first direction.

The irradiating of the laser to the third portion of the first side wiring provided on the first surface of the substrate may include irradiating the laser while moving from one side of a first sub-area of the third portion to another side of the first sub-area of the third portion, and irradiating the laser while moving from one side of a second sub-area of the third portion to another side of the second sub-area of the third portion.

The first sub-area of the third portion and the second sub-area of the third portion may overlap.

The moving direction of the laser in the first sub-area of the first portion and the second sub-area of the first portion may be the same as a moving direction of the laser in the first sub-area of the third portion and the second sub-area of the third portion.

The laser may irradiate infrared light.

According to an aspect of the present disclosure, there is provided a tiled display device including a first display device and a second display device, and a seam provided between the first display device and the second display device, the seam configured to couple the first display device to the second display device. Each of the first display device and the second display device includes a substrate including a first surface, a second surface opposite the first surface, a first chamfered surface extending from a side of the first surface, a second chamfered surface extending from a side of the second surface, and a first side surface connecting the first chamfered surface and the second chamfered surface, a plurality of subpixels provided on the first surface of the substrate and respectively including inorganic light emitting elements configured to emit light, a side wiring provided on the first surface, the first chamfered surface, the first side surface, the second chamfered surface, and the second surface of the substrate, and a circuit board provided on the second surface of the substrate and electrically connected to the side wiring. The side wiring includes metal particles and comprises a first portion provided on the first surface of the substrate and a second portion provided on the first side surface of the substrate, and a packing density of the metal particles of the first portion is higher than a packing density of the metal particles of the second portion.

According to the aforementioned and other embodiments of the present disclosure, the energy of a laser transmitted to a first portion corresponding to a front surface of a substrate may be higher than the energy of a laser transmitted to a third portion corresponding to a side surface of the substrate. Therefore, in the first portion connected to a first pad, metal particles of a side wiring may be closely packed together, thereby lowering resistivity and reducing contact resistance between the side wiring and the first pad.

According to the aforementioned and other embodiments of the present disclosure, because a second portion of the side wiring provided on a chamfered surface of the substrate is thinner than the first portion provided on the front surface of the substrate and the third portion provided on the side surface of the substrate, a sintering process using a laser is not performed on the second portion of the side wiring provided on the chamfered surface of the substrate. Therefore, it is possible to prevent or reduce damage to the second portion of the side wiring by the energy of the laser.

BRIEF DESCRIPTION OF THE DRAWINGS

The above and other embodiments and features of the present disclosure will become more apparent by describing embodiments thereof with reference to the attached drawings, in which:

FIG. 2 illustrates an example of a pixel of FIG. 1;

FIGS. 13-18, 19A and 19B are views for explaining the method of fabricating the display device according to one or more embodiments;

DETAILED DESCRIPTION

Figure 1A:
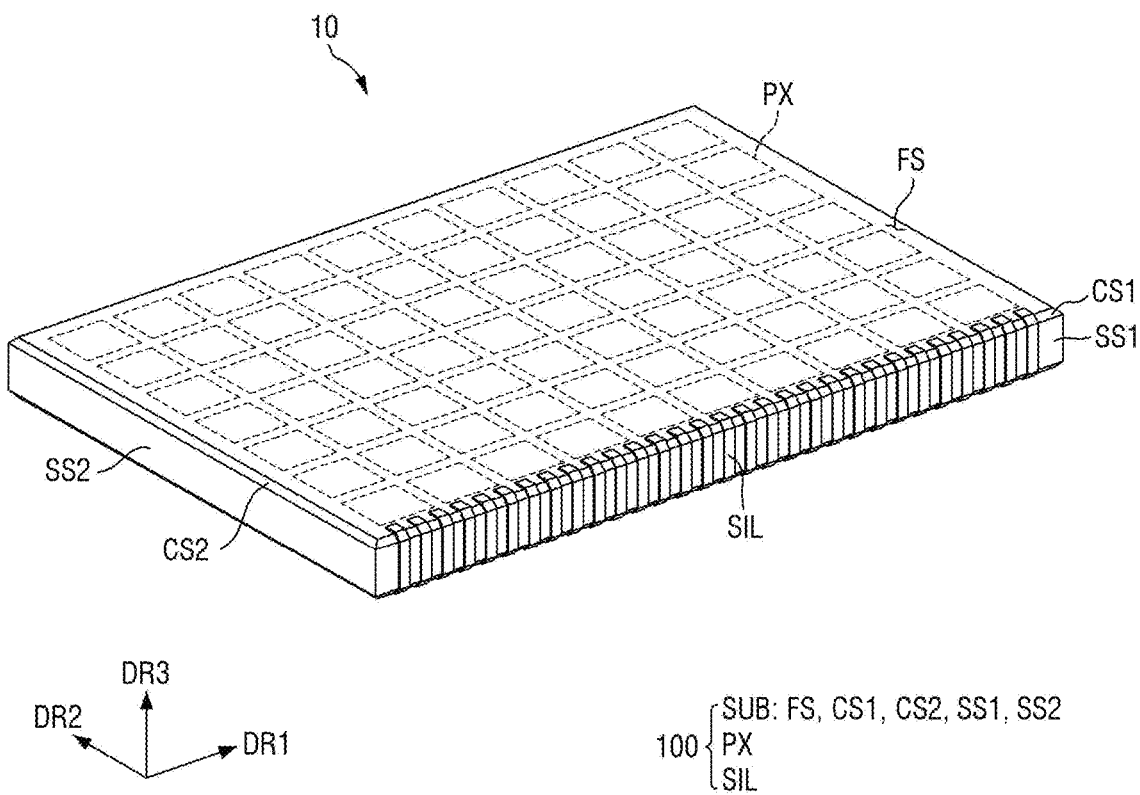
FIGS. 1A and 1B are perspective views of a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," "one of," and "selected from," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B. Further, the use of "may" when describing embodiments of the present disclosure refers to "one or more embodiments of the present disclosure".

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning for example consistent with their meaning in the context of the relevant art and/or the present specification, and should not be interpreted in an idealized or overly formal sense, unless expressly so defined herein.

Figure 1B:
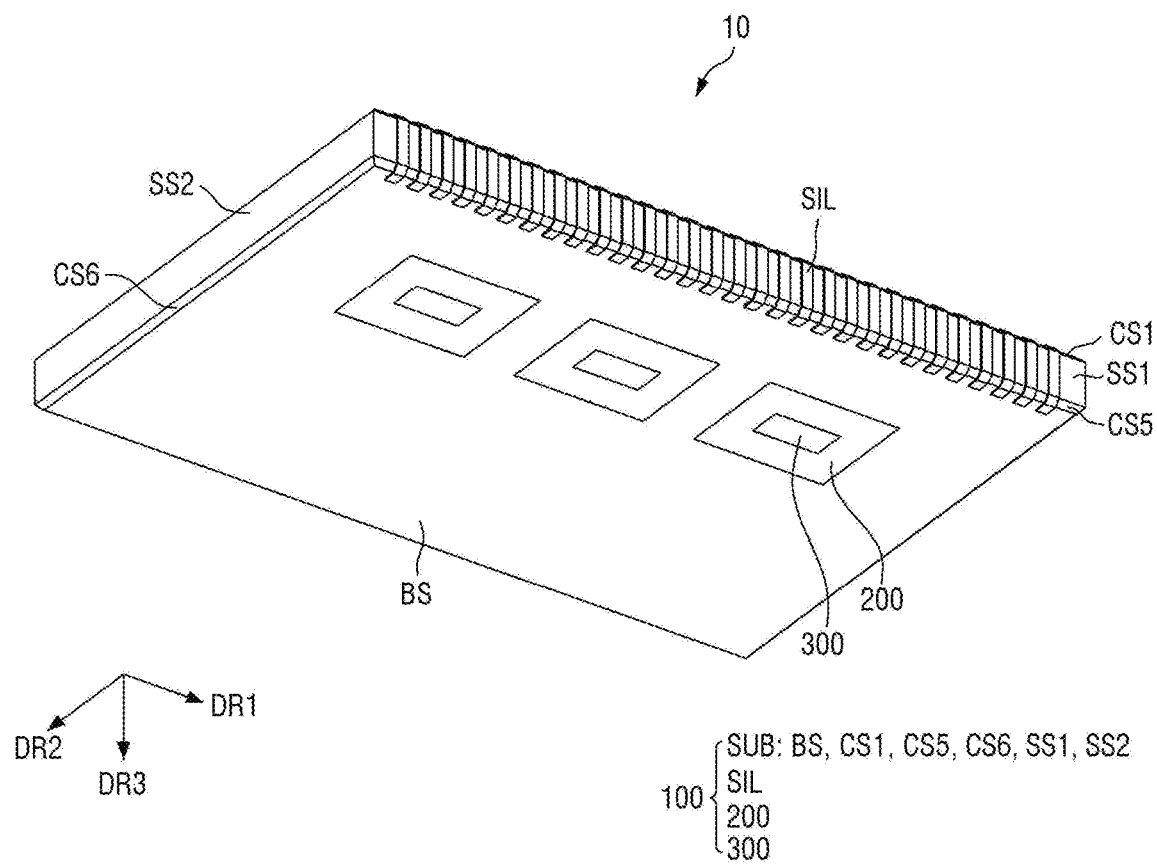

FIGS. 1A and 1B are perspective views of a display device 10 according to one or more embodiments.

Referring to FIGS. 1A and 1B, the display device 10 according to one or more embodiments is a device for displaying moving images and/or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and Internet of things (IoT) devices.

The display device 10 according to one or more embodiments may include a display panel 100, circuit boards 200, and display driving circuits 300.

The display panel 100 may include a substrate SUB, a plurality of pixels PX, and a plurality of side wirings (or side lines) SIL. The substrate SUB may include a first surface FS, a second surface BS, a plurality of chamfered surfaces CS1 through CS8, and a plurality of side surfaces SS1 through SS4.

The first surface FS may be a front surface of the substrate SUB. The first surface FS may have a rectangular (e.g., substantially rectangular) shape having long sides in a first direction DR1 and short sides in a second direction DR2.

The second surface BS may be a surface opposite the first surface FS. The second surface BS may be a rear surface of the substrate SUB. The second surface BS may have a rectangular (e.g., substantially rectangular) shape having long sides in the first direction DR1 and short sides in the second direction DR2. The second surface BS may be a surface opposite the first surface FS.

The chamfered surfaces CS1 through CS8 refer to obliquely cut surfaces provided between the first surface FS and the respective ones of the side surfaces SS1 through SS4 and between the second surface BS and the respective ones of the side surfaces SS1 through SS4 to prevent or reduce chipping defects of the side wirings SIL. Due to the chamfered surfaces CS1 through CS8, a bending angle of each of the side wirings SIL may be gentle. Thus, chipping or cracking of the side wirings SIL can be prevented or reduced.

A first chamfered surface CS1 may extend from a first side, for example, a lower side of the first surface FS. A second chamfered surface CS2 may extend from a second side, for example, a left side of the first surface FS. A third chamfered surface CS3 may extend from a third side, for example, an upper side of the first surface FS. A fourth chamfered surface CS4 may extend from a fourth side, for example, a right side of the first surface FS. An internal angle formed by the first surface FS and the first chamfered surface CS1, an internal angle formed by the first surface FS and the second chamfered surface CS2, an internal angle formed by the first surface FS and the third chamfered surface CS3, and an internal angle formed by the first surface FS and the fourth chamfered surface CS4 may be greater than 90 degrees.

A fifth chamfered surface CS5 may extend from a first side, for example, a lower side of the second surface BS. A sixth chamfered surface CS6 may extend from a second side, for example, a left side of the second surface BS. A seventh chamfered surface CS7 may extend from a third side, for example, an upper side of the second surface BS. An eighth chamfered surface CS8 may extend from a fourth side, for example, a right side of the second surface BS. An internal angle formed by the second surface BS and the fifth chamfered surface CS5, an internal angle formed by the second surface BS and the sixth chamfered surface CS6, an internal angle formed by the second surface BS and the seventh chamfered surface CS7, and an internal angle formed by the second surface BS and the eighth chamfered surface CS8 may be greater than 90 degrees.

A first side surface SS1 may extend from the first chamfered surface CS1. The first chamfered surface CS1 may be provided between the first surface FS and the first side surface SS1. The first side surface SS1 may be a lower side surface of the substrate SUB.

A second side surface SS2 may extend from the second chamfered surface CS2. The second chamfered surface CS2 may be provided between the first surface FS and the second side surface SS2. The second side surface SS2 may be a left side surface of the substrate SUB.

A third side surface SS3 may extend from the third chamfered surface CS3. The third chamfered surface CS3 may be provided between the first surface FS and the third side surface SS3. The third side surface SS3 may be an upper side surface of the substrate SUB.

A fourth side surface SS4 may extend from the fourth chamfered surface CS4. The fourth chamfered surface CS4 may be provided between the first surface FS and the fourth side surface SS4. The fourth side surface SS4 may be a right side surface of the substrate SUB.

The pixels PX may be provided on the first surface FS of the substrate SUB to display an image. The pixels PX may be arranged in a matrix form in the first direction DR1 and the second direction DR2. The pixels PX will be described in more detail herein below with reference to FIGS. 2 through 4.

Each of the side wirings SIL connects a first pad PD1 (see FIG. 5), for example, a front pad provided on the first surface FS and a second pad PD2 (see FIG. 6), for example, a rear pad provided on the second surface BS. The first pads PD1 (see FIG. 5) may be connected to data wirings (or data lines) connected to the pixels PX of the substrate SUB.

The side wirings SIL may be provided on the first surface FS, the second surface BS, at least any two of the chamfered surfaces CS1 through CS8, and at least any one of the side surfaces SS1 through SS4. For example, the side wirings SIL may be provided on the first surface FS, the second surface BS, the first chamfered surface CS1, the fifth chamfered surface CS5, and the first side surface SS1 to connect the first pads PD1 (see FIG. 5) provided on the first side of the first surface FS and the second pads PD2 (see FIG. 6) provided on the first side of the second surface BS.

When the display panel 100 additionally includes the first pads PD1 (see FIG. 5) provided on the second side of the first surface FS of the substrate SUB and the second pads PD2 (see FIG. 6) provided on the second side of the second surface BS of the substrate SUB, the side wirings SIL may be additionally provided on the first surface FS, the second surface BS, the second chamfered surface CS2, the sixth chamfered surface CS6, and the second side surface SS2. In addition, when the display panel 100 additionally includes the first pads PD1 (see FIG. 5) provided on the third side of the first surface FS of the substrate SUB and the second pads PD2 (see FIG. 6) provided on the third side of the second surface BS, the side wirings SIL may be additionally provided on the first surface FS, the second surface BS, the third chamfered surface CS3, the seventh chamfered surface CS7, and the third side surface SS3. Furthermore, when the display panel 100 additionally includes the first pads PD1 (see FIG. 5) provided on the fourth side of the first surface FS of the substrate SUB and the second pads PD2 (see FIG. 6) provided on the fourth side of the second surface BS, the side wirings SIL may be additionally provided on the first surface FS, the second surface BS, the fourth chamfered surface CS4, the eighth chamfered surface CS8, and the fourth side surface SS4.

The circuit boards 200 may be provided on the second surface BS of the substrate SUB. Each of the circuit boards 200 may be connected to third pads PD3 (see FIG. 6) provided on the second surface BS of the substrate SUB by using a conductive adhesive member such as an anisotropic conductive film. As will be described in more detail herein below with reference to FIG. 6, the third pads PD3 (see FIG. 6) are electrically connected to the second pads PD2, respectively. Accordingly, the circuit boards 200 may be electrically connected to the first pads PD1 through the side wirings SIL. Each of the circuit boards 200 may be a flexible film such as a flexible printed circuit board, a printed circuit board, and/or a chip on film.

Figure 5:
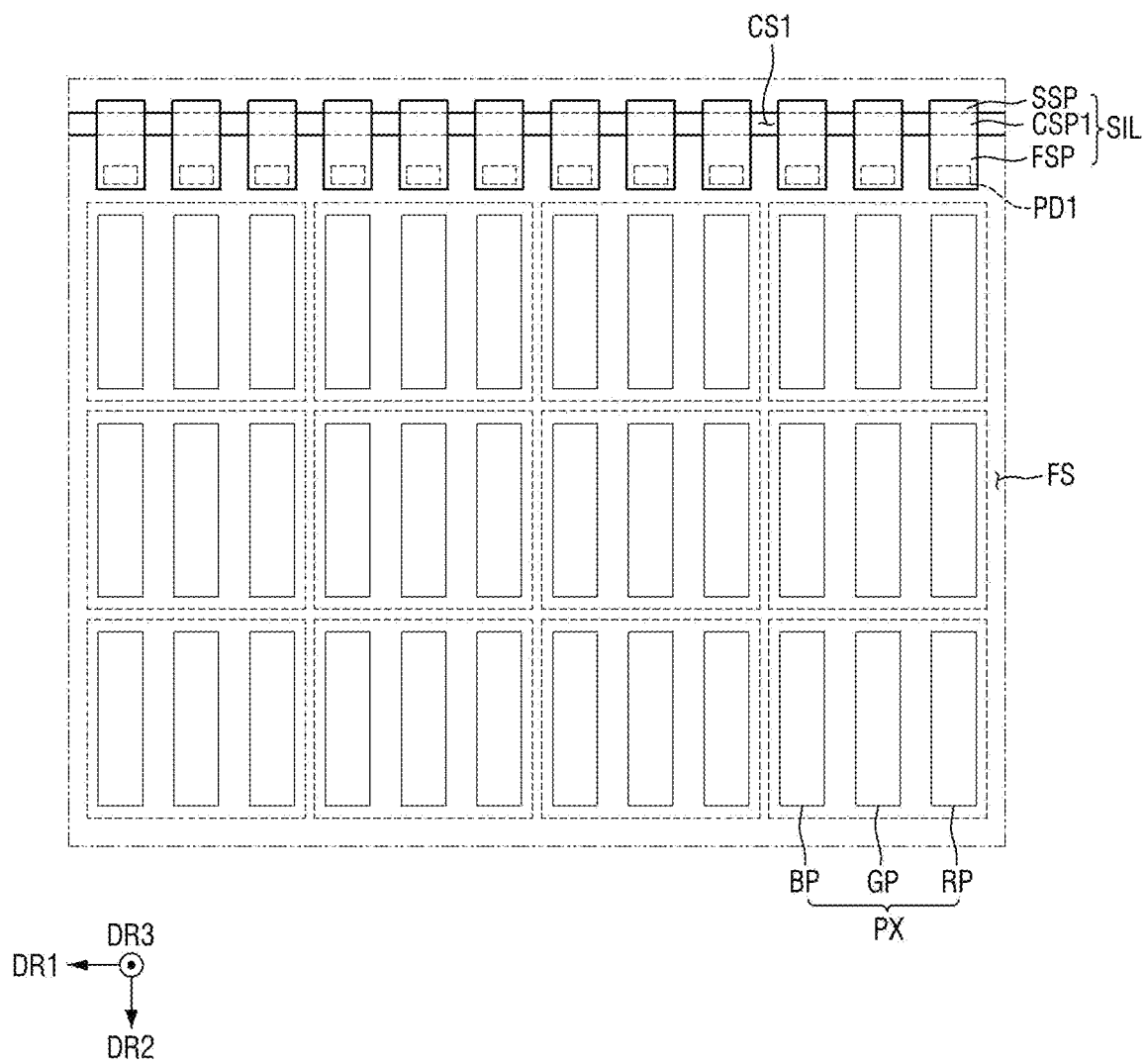
FIG. 5 is a plan view of the edge of the display device according to one or more embodiments.

The display driving circuits 300 may generate data voltages and supply the data voltages to the data wirings through the circuit boards 200, the third pads PD3 (see FIG. 6), the second pads PD2 (see FIG. 6), the side wirings SIL, and the first pads PD1 (see FIG. 5). The display driving circuits 300 may be formed as integrated circuits and attached onto the circuit boards 200. In some embodiments, the display driving circuits 300 may be directly attached to the second surface BS of the substrate SUB by using (utilizing) a chip on glass (COG) method.

As illustrated in FIG. 1, because the first pads PD1 (see FIG. 5) provided on the first surface FS and the second pads PD2 (see FIG. 6) provided on the second surface BS are connected (e.g., coupled) using the side wirings SIL, a flexible film bent along a side surface of the substrate SUB can be eliminated (e.g., need not be included). Accordingly, a substantially bezel-less display device can be implemented.

Figure 3:
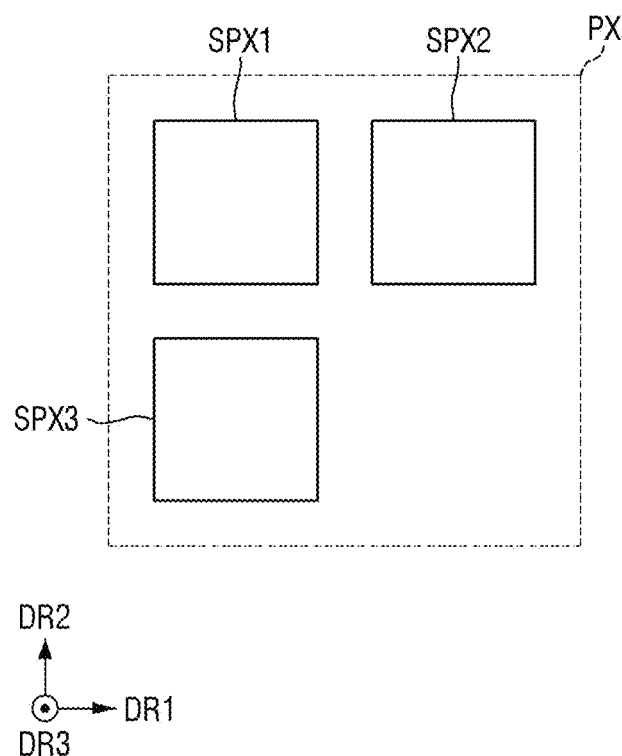
FIG. 3 illustrates another example of the pixel of FIG. 1.

FIG. 2 illustrates an example of a pixel PX of FIG. 1. FIG. 3 illustrates another example of the pixel of FIG. 1.

Referring to FIGS. 2 and 3, each of the pixels PX may include a plurality of subpixels SPX1 through SPX3. In FIGS. 2 and 3, each of the pixels PX includes three subpixels SPX1 through SPX3, for example, a first subpixel SPX1, a second subpixel SPX2, and a third subpixel SPX3, but embodiments of the present specification are not limited thereto. Each of the first subpixel SPX1, the second subpixel SPX2, and the third subpixel SPX3 may be connected to any one of the data wirings and at least one of scan wirings (or scan lines).

The first subpixel SPX1, the second subpixel SPX2, and the third subpixel SPX3 may each independently have a rectangular, square, or rhombus planar shape. For example, the first subpixel SPX1, the second subpixel SPX2, and the third subpixel SPX3 may each independently have a rectangular planar shape having short sides in the first direction DR1 and long sides in the second direction DR2 as illustrated in FIG. 2. In some embodiments, the first subpixel SPX1, the second subpixel SPX2, and the third subpixel SPX3 may each independently have a square or rhombus planar shape including sides having the same length in the first direction DR1 and the second direction DR2 as illustrated in FIG. 3.

As illustrated in FIG. 2, the first subpixel SPX1, the second subpixel SPX2, and the third subpixel SPX3 may be arranged in the first direction DR1. In some embodiments, the first subpixel SPX1 and any one of the second subpixel SPX2 and the third subpixel SPX3 may be arranged in the first direction DR1, and the first subpixel SPX1 and the other one of the second subpixel SPX2 and the third subpixel SPX3 may be arranged in the second direction DR2. For example, as illustrated in FIG. 3, the first subpixel SPX1 and the second subpixel SPX2 may be arranged in the first direction DR1, and the first subpixel SPX1 and the third subpixel SPX3 may be arranged in the second direction DR2.

In some embodiments, the second subpixel SPX2 and any one of the first subpixel SPX1 and the third subpixel SPX3 may be arranged in the first direction DR1, and the second subpixel SPX2 and the other one of the first subpixel SPX1 and the third subpixel SPX3 may be arranged in the second direction DR2. In some embodiments, the third subpixel SPX3 and any one of the first subpixel SPX1 and the second subpixel SPX2 may be arranged in the first direction DR1, and the third subpixel SPX3 and the other one of the first subpixel SPX1 and the second subpixel SPX2 may be arranged in the second direction DR2.

The first subpixel SPX1 may emit first light, the second subpixel SPX2 may emit second light, and the third subpixel SPX3 may emit third light. Here, the first light may be light of a red wavelength band, the second light may be light of a green wavelength band, and the third light may be light of a blue wavelength band. The red wavelength band may be a wavelength band in a range of about 600 to 750 nm, the green wavelength band may be a wavelength band in a range of about 480 to 560 nm, and the blue wavelength band may be a wavelength band in a range of about 370 to 460 nm. However, embodiments of the present specification are not limited thereto.

The first subpixel SPX1, the second subpixel SPX2, and the third subpixel SPX3 may each independently include an inorganic light emitting element including an inorganic semiconductor as a light emitting element that emits (e.g., is configured to emit) light. For example, the inorganic light emitting element may be a flip-chip type micro-light emitting diode (LED), but embodiments of the present specification are not limited thereto.

As illustrated in FIGS. 2 and 3, the area of the first subpixel SPX1, the area of the second subpixel SPX2, and the area of the third subpixel SPX3 may be substantially the same. However, embodiments of the present specification are not limited thereto. Any one of the area of the first subpixel SPX1, the area of the second subpixel SPX2, and the area of the third subpixel SPX3 may be different from the other ones. In some embodiments, any two of the area of the first subpixel SPX1, the area of the second subpixel SPX2, and the area of the third subpixel SPX3 may be substantially the same, and the other one may be different from the two. In some embodiments, the area of the first subpixel SPX1, the area of the second subpixel SPX2, and the area of the third subpixel SPX3 may be different from each other.

Figure 4:
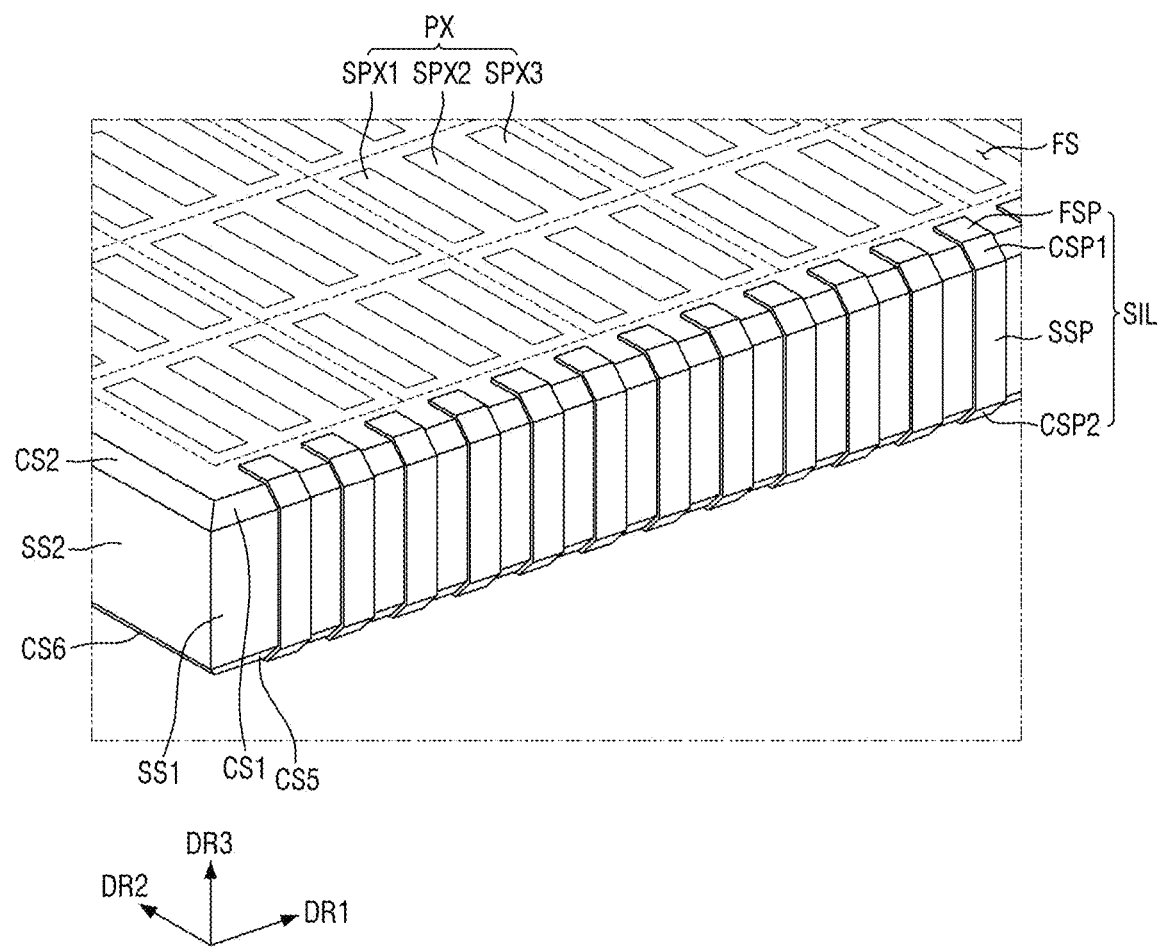
FIG. 4 is a more detailed perspective view of an edge of the display device according to one or more embodiments.
Figure 6:
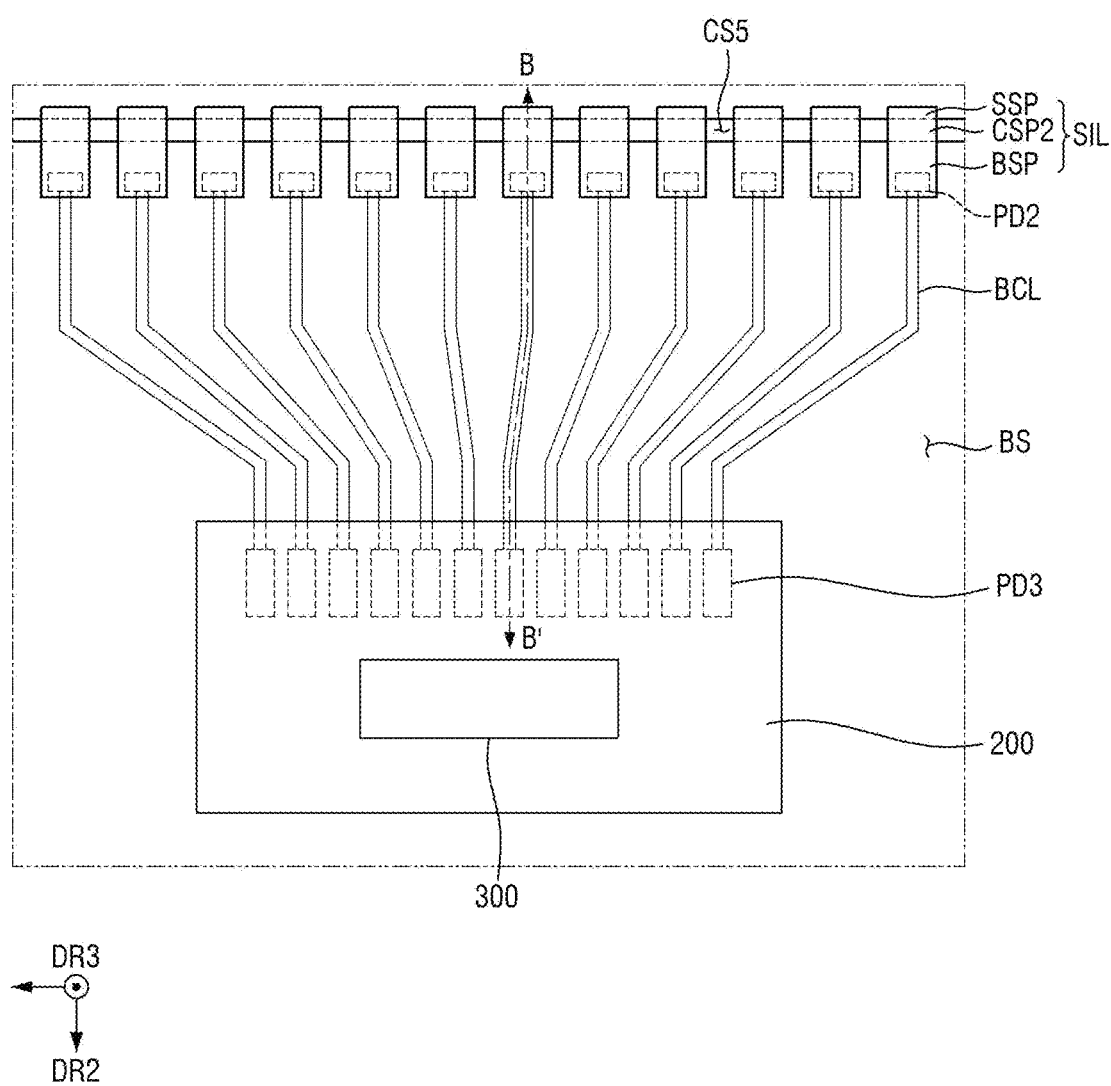
FIG. 6 is a rear view of the edge of the display device according to one or more embodiments.

FIG. 4 is a detailed perspective view of an edge of a display panel 100 according to one or more embodiments. FIG. 5 is a plan view of the edge of the display panel 100 according to one or more embodiments. FIG. 6 is a rear view of the edge of the display panel 100 according to one or more embodiments.

Referring to FIGS. 4 through 6, the display panel 100 includes the first pads PD1, the second pads PD2, the third pads PD3, and bottom connection wirings (or bottom connection lines) BCL.

The first pads PD1 may be front pads provided on the first surface FS corresponding to the front surface of the substrate SUB. The first pads PD1 may be provided at an edge on the first side of the first surface FS of the substrate SUB. The first pads PD1 may be arranged with each other in the first direction DR1.

The second pads PD2 may be rear pads provided on the second surface BS corresponding to the rear surface of the substrate SUB. The second pads PD2 may be provided at an edge on the first side of the second surface BS of the substrate SUB. The second pads PD2 may be arranged with each other in the first direction DR1.

The third pads PD3 may be rear pads provided on the second surface BS of the substrate SUB. The third pads PD3 may be provided closer to the center of the second surface BS of the substrate SUB than the second pads PD2. The third pads PD3 may be arranged with each other in the first direction DR1. A distance between the third pads PD3 neighboring each other in the first direction DR1 may be smaller than a distance between the second pads PD2 neighboring each other in the first direction DR1 so that more third pads PD3 can be connected to each circuit board 200 (e.g., so that a suitable number of the third pads PD3 may fit on the circuit board 200).

The bottom connection wirings BCL connect the second pads PD2 and the third pads PD3. Because the distance between the second pads PD2 neighboring each other in the first direction DR1 and the distance between the third pads PD3 neighboring each other in the first direction DR1 are different, the bottom connection wirings BCL may be bent at least once (e.g., to accommodate for the difference in distances). The bottom connection wirings BCL may be integrally formed with the second pads PD2 and the third pads PD3. Each of the second pads PD2, the third pads PD3, and the bottom connection wirings BCL may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

Each of the side wirings SIL may include first through fifth portions FSP, CSP1, SSP, CSP2, and BSP.

The first portion FSP corresponds to a front portion provided on the first surface FS of the substrate SUB. The first portion FSP may be provided on a first pad PD1 and may completely (e.g., entirely) cover the first pad PD1. The first portion FSP may be connected (e.g., electrically coupled) to the first pad PD1.

The second portion CSP1 corresponds to a first chamfered portion provided on the first chamfered surface CS1 of the substrate SUB. The second portion CSP1 may be provided between the first portion FSP and the third portion SSP.

The third portion SSP corresponds to a side portion provided on the first side surface SS1 of the substrate SUB. The third portion SSP may be provided between the second portion CSP1 and the fourth portion CSP2.

The fourth portion CSP2 corresponds to a second chamfered portion provided on the fifth chamfered surface CS5 of the substrate SUB. The fourth portion CSP2 may be provided between the third portion SSP and the fifth portion BSP.

The fifth portion BSP corresponds to a rear portion provided on the second surface BS of the substrate SUB. The fifth portion BSP may be provided on a second pad PD2 and may completely (e.g., entirely) cover the second pad PD2. The fifth portion BSP may be connected to the second pad PD2.

The side wirings SIL may include metal powder including metal particles such as silver (Ag) and/or copper (Cu), and/or a polymer such as acrylic resin and/or epoxy resin. The metal powder may allow the side wirings SIL to have conductivity, and the polymer may serve as a binder connecting the metal particles.

For example, the side wirings SIL may be formed by printing a metal paste including metal particles, monomers, and a solvent on the substrate SUB using a silicon pad and then sintering the metal paste using a laser. As the monomers react to form a polymer due to the heat of the laser during the sintering process, the metal particles may be closely packed and agglomerated with each other. Accordingly, the resistivity of the side wirings SIL may be lowered. The method of forming the side wirings SIL will be described in more detail herein below with reference to FIG. 12.

Figure 13:
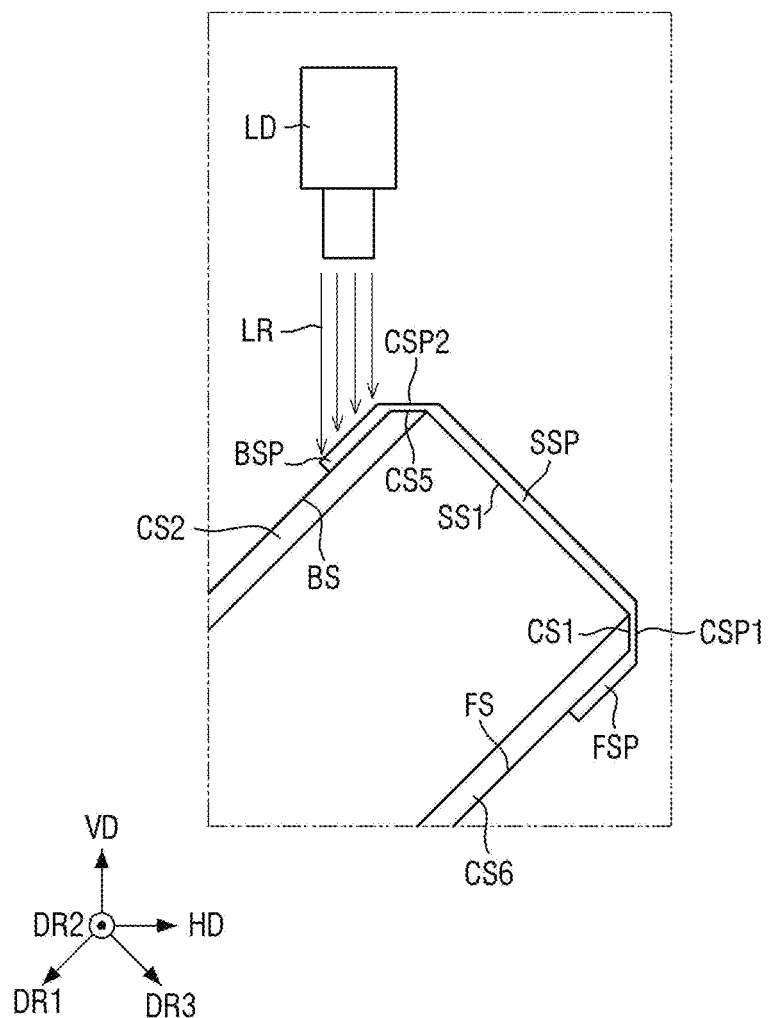

A thickness of each side wiring SIL may vary according to the first through fifth portions FSP, CSP1, SSP, CSP2, and BSP. When the side wirings SIL are formed, a metal paste is rubbed and applied onto the first surface FS, the second surface BS, the first chamfered surface CS1, the fifth chamfered surface CS5, and the first side surface SS1 of the substrate SUB using a silicon pad. Here, the force applied by the silicon pad on the first chamfered surface CS1 and the fifth chamfered surface CS5 may be greater than the force applied by the silicon pad on the first surface FS, the second surface BS, and the first side surface SS1. For this reason, as illustrated in FIG. 13, a thickness of the second portion CSP1 provided on the first chamfered surface CS1 and a thickness of the fourth portion CSP2 provided on the fifth chamfered surface CS5 may be smaller than a thickness of the first portion FSP, a thickness of the third portion SSP, and a thickness of the fifth portion BSP. For example, while the thickness of the second portion CSP1 and the thickness of the fourth portion CSP2 may be about 1 to 3 µm, the thickness of the first portion FSP, the thickness of the third portion SSP, and the thickness of the fifth portion BSP may be about 3 to 5 µm.

Because the thickness of the second portion CSP1 and the thickness of the fourth portion CSP2 of each side wiring SIL are smaller than the thickness of the first portion FSP, the thickness of the third portion SSP, and the thickness of the fifth portion BSP, the second portion CSP1 and the fourth portion CSP2 of each side wiring SIL are highly likely to be damaged by a laser during the sintering process. Therefore, the sintering process using a laser may not be performed on the second portion CSP1 and the fourth portion CSP2 of each side wiring SIL.

In addition, each side wiring SIL is connected to a first pad PD1 through the first portion FSP and is connected to a second pad PD2 through the fifth portion BSP. As the metal particles of the first portion FSP of each side wiring SIL are closely packed and agglomerated with the first pad PD1 in the sintering process, the contact resistance between the first pad PD1 and the side wiring SIL may be lowered. In addition, as the metal particles of the fifth portion BSP of each side wiring SIL are closely packed and agglomerated with the second pad PD2 in the sintering process, the contact resistance between the second pad PD2 and the side wiring SIL may be lowered. Therefore, in the sintering process, the energy of a laser irradiated to the first portion FSP and the fifth portion BSP of each side wiring SIL may be higher than the energy of a laser irradiated to the third portion SSP.

Figure 7:
FIG. 7 is a microscopic image showing metal particles of a second portion of a side wiring.
Figure 8:
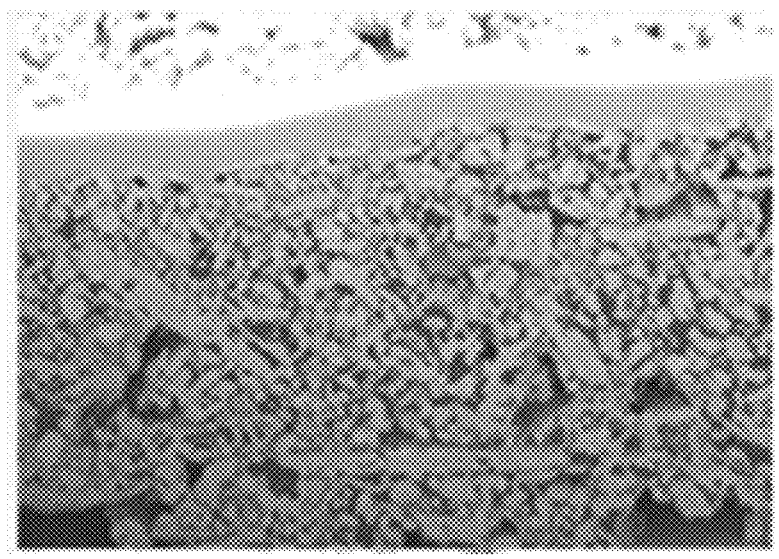
FIG. 8 is a microscopic image showing metal particles of a third portion of the side wiring.
Figure 9:
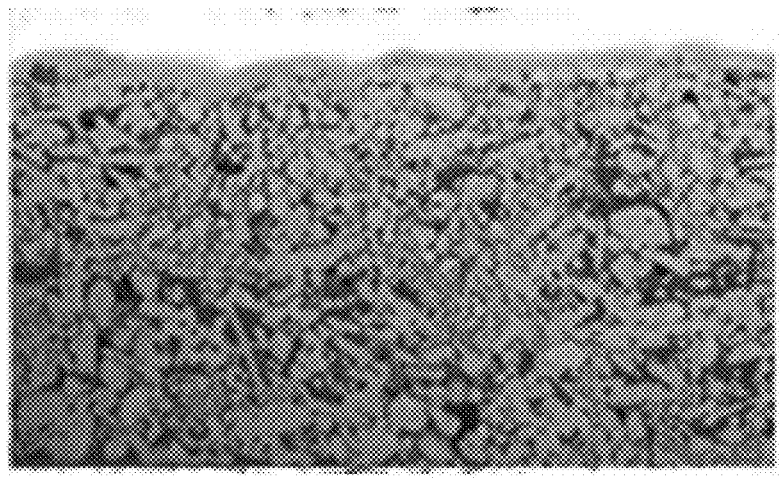
FIG. 9 is a microscopic image showing metal particles of a first portion of the side wiring.

In summary, in the sintering process, a laser of the highest (e.g., suitably high) energy may be irradiated to the first portion FSP and the fifth portion BSP of each side wiring SIL, and no laser may be irradiated to the second portion CSP1 and the fourth portion CSP2. As a laser of higher energy is irradiated, the metal particles of the side wirings SIL may be more closely packed and solidified. Therefore, the metal packing density of the first portion FSP and the fifth portion BSP of each side wiring SIL illustrated in FIG. 9 may be higher than the metal packing density of the third portion SSP of each side wiring SIL illustrated in FIG. 8. In addition, the metal packing density of the third portion SSP of each side wiring SIL illustrated in FIG. 8 may be higher than the metal packing density of the second portion CSP1 and the fourth portion CSP2 of each side wiring SIL illustrated in FIG. 7. The metal packing density refers to the proportion of metal particles in a set or predetermined space.

Because a higher metal packing density indicates a higher degree of agglomeration of metal particles, resistivity may be lower. Therefore, the resistivity of the first portion FSP and the resistivity of the fifth portion BSP of each side wiring SIL may be lower than the resistivity of the third portion SSP of each side wiring SIL. In addition, the resistivity of the third portion SSP of each side wiring SIL may be lower than the resistivity of the second portion CSP1 and the resistivity of the fourth portion CSP2 of each side wiring SIL.

Figure 10:
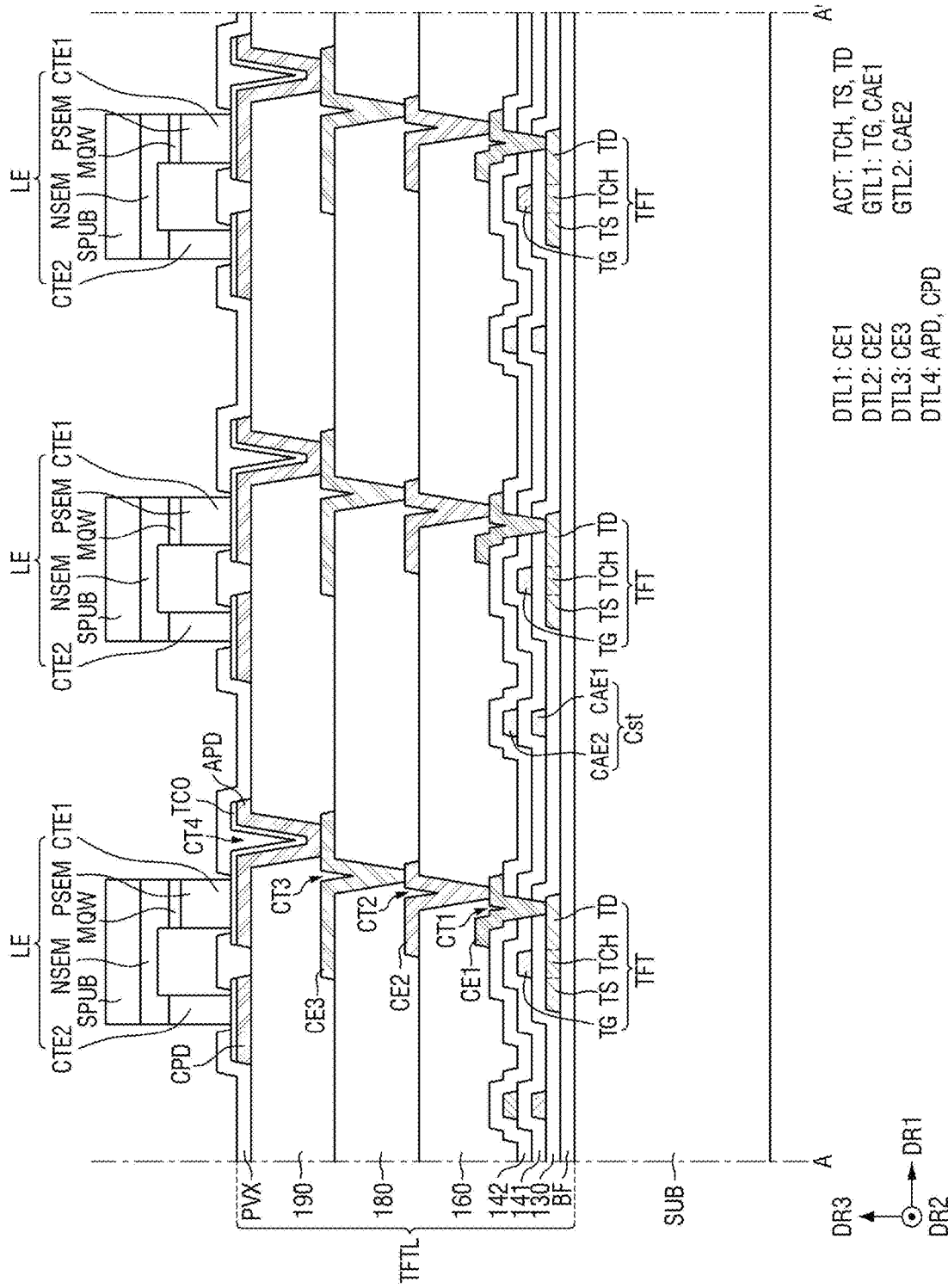
FIG. 10 is a cross-sectional view of an example of a display panel taken along line A-A' of FIG. 2.
Figure 11:
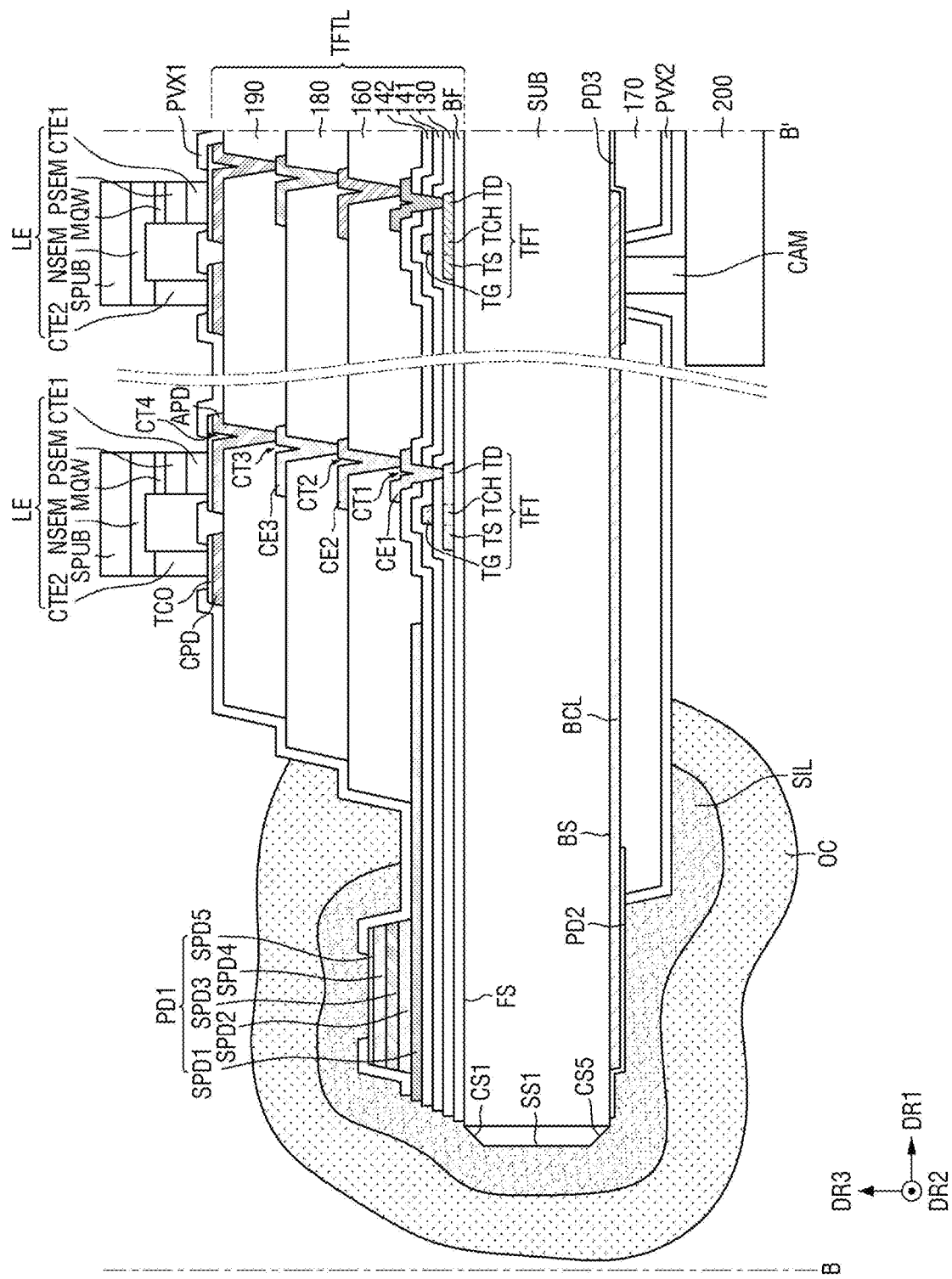
FIG. 11 is a cross-sectional view of an example of the display panel taken along line B-B' of FIG. 6.

FIG. 10 is a cross-sectional view of an example of the display panel 100 taken along line A-A' of FIG. 2. FIG. 11 is a cross-sectional view of an example of the display panel 100 taken along line B-B' of FIG. 6.

Referring to FIGS. 10 and 11, the display panel 100 may include a thin-film transistor layer TFTL and light emitting elements LE provided on the substrate SUB. The thin-film transistor layer TFTL may be a layer in which thin-film transistors TFT are formed.

The thin-film transistor layer TFTL includes an active layer ACT, a first gate layer GTL1, a second gate layer GTL2, a first data metal layer DTL1, a second data metal layer DTL2, a third data metal layer DTL3, and a fourth data metal layer DTL4. In one or more embodiments, the thin-film transistor layer TFTL includes a buffer layer BF, a gate insulating layer 130, a first interlayer insulating film 141, a second interlayer insulating film 142, a first planarization layer 160, and a second planarization layer 180.

The substrate SUB may be a base substrate or a base member for supporting the display device 10. The substrate SUB may be a rigid substrate made of glass, but embodiments of the present specification are not limited thereto. The substrate SUB may be a flexible substrate that can be bent, folded, rolled, and/or the like. In this case, the substrate SUB may include an insulating material, for example, polymer resin such as polyimide (PI).

The buffer layer BF may be provided on a surface of the substrate SUB. The buffer layer BF may be a layer for preventing or reducing penetration of air and/or moisture. The buffer layer BF may be composed of a plurality of inorganic layers stacked alternately with each other. For example, the buffer layer BF may be a multilayer in which one or more inorganic layers selected from a silicon nitride layer, a silicon oxynitride layer, a silicon oxide layer, a titanium oxide layer, and an aluminum oxide layer are alternately stacked. The buffer layer BF may also be omitted (e.g., may not be provided).

The active layer ACT may be provided on the buffer layer BF. The active layer ACT may include a silicon semiconductor such as polycrystalline silicon, monocrystalline silicon, low-temperature polycrystalline silicon, and/or amorphous silicon.

The active layer ACT may include a channel TCH, a first electrode TS, and a second electrode TD of each thin-film transistor TFT. The channel TCH of each thin-film transistor TFT may be a region overlapping a gate electrode TG of the thin-film transistor TFT in a third direction DR3 which is a thickness direction of the substrate SUB. The first electrode TS of each thin-film transistor TFT may be provided on one side of the channel TCH, and the second electrode TD may be provided on the other side of the channel TCH. The first electrode TS and the second electrode TD of each thin-film transistor TFT may be regions not overlapping the gate electrode TG in the third direction DR3. The first electrode TS and the second electrode TD of each thin-film transistor TFT may be regions formed to have conductivity by doping a silicon semiconductor or an oxide semiconductor with ions.

The gate insulating layer 130 may be provided on the active layer ACT. The gate insulating layer 130 may be made of an inorganic layer, for example, a silicon nitride layer, a silicon oxynitride layer, a silicon oxide layer, a titanium oxide layer, and/or an aluminum oxide layer.

The first gate layer GTL1 may be provided on the gate insulating layer 130. The first gate layer GTL1 may include the gate electrode TG of each thin-film transistor TFT and first capacitor electrodes CAE1. The first gate layer GTL1 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The first interlayer insulating film 141 may be provided on the first gate layer GTL1. The first interlayer insulating film 141 may be made of an inorganic layer, for example, a silicon nitride layer, a silicon oxynitride layer, a silicon oxide layer, a titanium oxide layer, and/or an aluminum oxide layer.

The second gate layer GTL2 may be provided on the first interlayer insulating film 141. The second gate layer GTL2 may include second capacitor electrodes CAE2. The second gate layer GTL2 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The second interlayer insulating film 142 may be provided on the second gate layer GTL2. The second interlayer insulating film 142 may be made of an inorganic layer, for example, a silicon nitride layer, a silicon oxynitride layer, a silicon oxide layer, a titanium oxide layer, and/or an aluminum oxide layer.

The first data metal layer DTL1 including first connection electrodes CE1, a first sub-pad SPD1, and a data wiring DL may be provided on the second interlayer insulating film 142. The data wiring DL may be integrally formed with the first sub-pad SPD1, but embodiments of the present specification are not limited thereto. The first data metal layer DTL1 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

Each of the first connection electrodes CE1 may be connected to the first electrode TS or the second electrode TD of a thin-film transistor TFT through a first contact hole CT1 penetrating the first interlayer insulating film 141 and the second interlayer insulating film 142.

The first planarization layer 160 may be provided on the first data metal layer DTL1 to flatten (e.g., substantially planarize) steps due to the active layer ACT, the first gate layer GTL1, the second gate layer GTL2, and the first data metal layer DTL1. The first planarization layer 160 may be made of an organic layer such as acryl resin, epoxy resin, phenolic resin, polyamide resin, and/or polyimide resin.

The second data metal layer DTL2 may be provided on the first planarization layer 160. The second data metal layer DTL2 may include second connection electrodes CE2 and a second sub-pad SPD2. Each of the second connection electrodes CE2 may be connected to a first connection electrode CE1 through a second contact hole CT2 penetrating the first planarization layer 160. The second data metal layer DTL2 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The second planarization layer 180 may be provided on the second data metal layer DTL2. The second planarization layer 180 may be made of an organic layer such as acryl resin, epoxy resin, phenolic resin, polyamide resin, and/or polyimide resin.

The third data metal layer DTL3 may be provided on the second planarization layer 180. The third data metal layer DTL3 may include third connection electrodes CE3 and a third sub-pad SPD3. Each of the third connection electrodes CE3 may be connected to a second connection electrode CE2 through a third contact hole CT3 penetrating the second planarization layer 180. The third data metal layer DTL3 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

A third planarization layer 190 may be provided on the third data metal layer DTL3. The third planarization layer 190 may be made of an organic layer such as acryl resin, epoxy resin, phenolic resin, polyamide resin, and/or polyimide resin.

The fourth data metal layer DTL4 may be provided on the third planarization layer 190. The fourth data metal layer DTL4 may include anode pad electrodes APD, cathode pad electrodes CPD, and a fourth sub-pad SPD4. Each of the anode pad electrodes APD may be connected to a third connection electrode CE3 through a fourth contact hole CT4 penetrating the third planarization layer 190. The cathode pad electrodes CPD may be supplied with a first power supply voltage which is a low potential voltage. The fourth data metal layer DTL4 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

A transparent conductive layer TCO may be provided on each of the anode pad electrodes APD and the cathode pad electrodes CPD to increase adhesion to a first contact electrode CTE1 and a second contact electrode CTE2 of each of the light emitting elements LE. Also, a fifth sub-pad SPD5 is provided on the fourth sub-pad SPD4. The transparent conductive layer TCO and the fifth sub-pad SPD5 may be made of a transparent conductive oxide such as indium tin oxide (ITO) and/or indium zinc oxide (IZO).

A first passivation layer PVX1 may be provided on the anode pad electrodes APD, the cathode pad electrodes CPD, and a first pad PD1. The first passivation layer PVX1 may cover edges of the anode pad electrodes APD, the cathode pad electrodes CPD, and the first pad PD1. The first passivation layer PVX1 may be made of an inorganic layer, for example, a silicon nitride layer, a silicon oxynitride layer, a silicon oxide layer, a titanium oxide layer, and/or an aluminum oxide layer.

Each of the light emitting elements LE is illustrated as a flip-chip type (or kind) micro-LED in which the first contact electrode CTE1 and the second contact electrode CTE2 face the anode pad electrode APD and the cathode pad electrode CPD. Each of the light emitting elements LE may be an inorganic light emitting element made of an inorganic material such as GaN. Each of the light emitting elements LE may have a length of several to hundreds of μm in the first direction DR1, in the second direction DR2, and in the third direction DR3. For example, each of the light emitting elements LE may have a length of about 100 μm or less in the first direction DR1, in the second direction DR2, and in the third direction DR3.

The light emitting elements LE may be grown on a semiconductor substrate such as a silicon wafer. Each of the light emitting elements LE may be directly transferred from the silicon wafer onto an anode pad electrode APD and a cathode pad electrode CPD of the substrate SUB. In some embodiments, each of the light emitting elements LE may be transferred onto an anode pad electrode APD and a cathode pad electrode CPD of the substrate SUB by an electrostatic method using an electrostatic head and/or a stamping method using an elastic polymer material such as PDMS and/or silicon as a transfer substrate.

Each of the light emitting elements LE may be a light emitting structure including a base substrate SPUB, an n-type semiconductor NSEM, an active layer MQW, a p-type semiconductor PSEM, the first contact electrode CTE1, and the second contact electrode CTE2.

The base substrate SPUB may be a sapphire substrate, but embodiments of the present specification are not limited thereto.

The n-type semiconductor NSEM may be provided on a surface of the base substrate SPUB. For example, the n-type semiconductor NSEM may be provided on a lower surface of the base substrate SPUB. The n-type semiconductor NSEM may be made of GaN doped with an n-type conductivity-type dopant such as Si, Ge, and/or Sn.

The active layer MQW may be provided on a portion of a surface of the n-type semiconductor NSEM. The active layer MQW may include a material having a single or multiple quantum well structure. When the active layer MQW includes a material having a multiple quantum well structure, it may have a structure in which a plurality of well layers and a plurality of barrier layers are alternately stacked. Here, the well layers may be made of InGaN, and the barrier layers may be made of GaN and/or AlGaN, but embodiments of the present specification are not limited thereto. In some embodiments, the active layer MQW may have a structure in which a semiconductor material having a large band gap energy and a semiconductor material having a small band gap energy are alternately stacked, or may include different group 3 to 5 semiconductor materials depending on the wavelength band of light that it emits (or is configured to emit).

The p-type semiconductor PSEM may be provided on a surface of the active layer MQW. The p-type semiconductor PSEM may be made of GaN doped with a p-type conductivity-type dopant such as Mg, Zn, Ca, Se, and/or Ba.

The first contact electrode CTE1 may be provided on the p-type semiconductor PSEM, and the second contact electrode CTE2 may be provided on another portion of the surface of the n-type semiconductor NSEM. The portion of the surface of the n-type semiconductor NSEM on which the second contact electrode CTE2 is provided may be spaced apart from the portion of the surface of the n-type semiconductor NSEM on which the active layer MQW is provided.

The first contact electrode CTE1 and the anode pad electrode APD may be bonded to each other through a conductive adhesive member such as an anisotropic conductive film and/or an anisotropic conductive paste. In some embodiments, the first contact electrode CTE1 and the anode pad electrode APD may be bonded to each other through a soldering process.

The first pad PD1 may include the first through fifth sub-pads SPD1 through SPD5. The second sub-pad SPD2 may be provided on the first sub-pad SPD1, and the third sub-pad SPD3 may be provided on the second sub-pad SPD2. The fourth sub-pad SPD4 may be provided on the third sub-pad SPD3, and the fifth sub-pad SPD5 may be provided on the fourth sub-pad SPD4. An upper surface of the first sub-pad SPD1 may contact a lower surface of the second sub-pad SPD2, and an upper surface of the second sub-pad SPD2 may contact a lower surface of the third sub-pad SPD3. An upper surface of the third sub-pad SPD3 may contact a lower surface of the fourth sub-pad SPD4, and an upper surface of the fourth sub-pad SPD4 may contact a lower surface of the fifth sub-pad SPD5.

A bottom connection wiring BCL may be provided on the rear surface of the substrate SUB. The bottom connection wiring BCL may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

A second pad PD2 may be provided at an end (e.g., edge) of the bottom (e.g., bottom surface of) connection wiring BCL, and a third pad PD3 may be provided at the other end (e.g., edge) of the bottom connection wiring BCL. The second pad PD2 and the third pad PD3 may be made of a transparent conductive oxide such as indium tin oxide (ITO) and/or indium zinc oxide (IZO).

A fourth planarization layer 170 may be provided on the bottom connection wiring BCL and the rear surface of the substrate SUB. The fourth planarization layer 170 may be made of an organic layer such as acryl resin, epoxy resin, phenolic resin, polyamide resin, and/or polyimide resin.

A second passivation layer PVX2 may be provided on the fourth planarization layer 170. The second passivation layer PVX2 may be made of an inorganic layer, for example, a silicon nitride layer, a silicon oxynitride layer, a silicon oxide layer, a titanium oxide layer, and/or an aluminum oxide layer.

A side wiring SIL may be provided on the first surface FS, the first chamfered surface CS1, the first side surface SS1, the fifth chamfered surface CS5, and the second surface BS of the substrate SUB. The side wiring SIL may be provided on the first pad PD1 provided on an edge of the first surface FS of the substrate SUB and may be connected to the first pad PD1. The side wiring SIL may be provided on the second pad PD2 provided on an edge of the second surface BS of the substrate SUB and may be connected to the second pad PD2. The side wiring SIL may contact the first chamfered surface CS1, the first side surface SS1, and the fifth chamfered surface CS5 of the substrate SUB.

An overcoat layer OC may be provided on the first surface FS, the first chamfered surface CS1, the first side surface SS1, the fifth chamfered surface CS5, and the second surface BS of the substrate SUB. The overcoat layer OC may cover the side wiring SIL. The overcoat layer OC may be made of an organic layer such as acryl resin, epoxy resin, phenolic resin, polyamide resin, and/or polyimide resin.

A circuit board 200 may be provided on the rear surface of the substrate SUB. The circuit board 200 may be connected to the third pad PD3, at least a portion of which may be exposed without being covered by the fourth planarization layer 170 and the second passivation layer PVX2, using a conductive adhesive member CAM. The circuit board 200 may be connected to the third pad PD3 through the conductive adhesive member CAM. The conductive adhesive member CAM may be an anisotropic conductive film and/or an anisotropic conductive paste.

Figure 12:
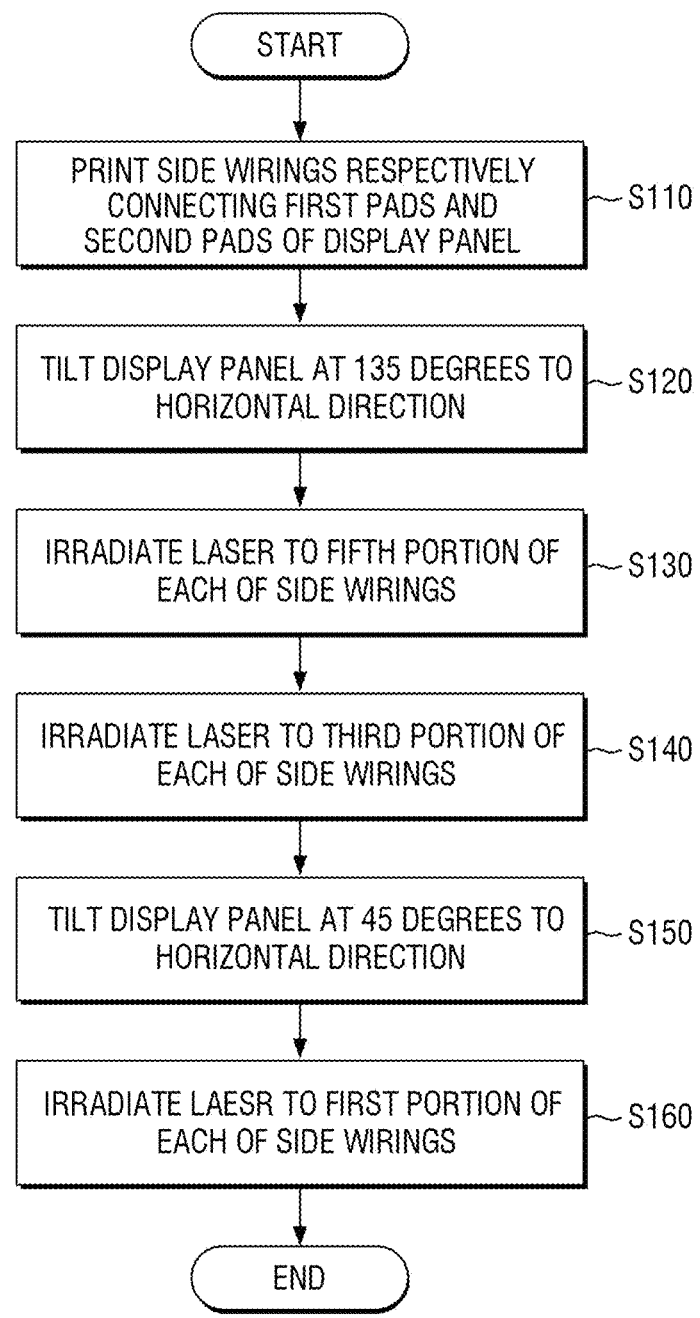
FIG. 12 is a flowchart illustrating a method of fabricating a display device according to one or more embodiments.
Figure 20:
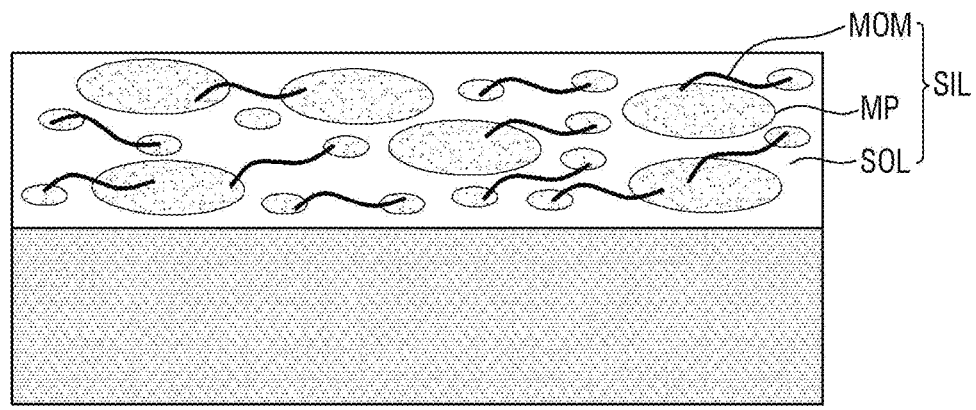
FIGS. 20-22 are views showing a sintered state of metal particles of a side wiring according to laser energy.
Figure 21:
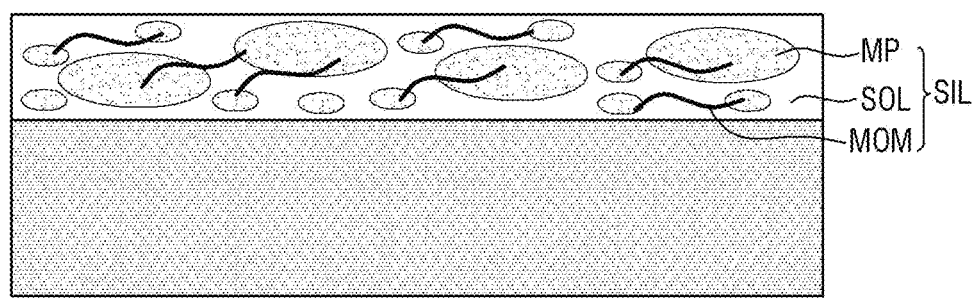
Figure 22:
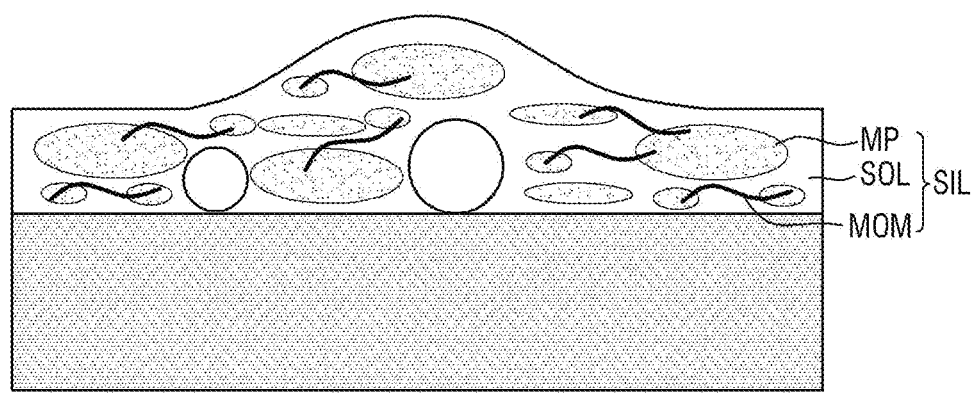

FIG. 12 is a flowchart illustrating a method of fabricating a display device according to one or more embodiments. FIGS. 13 through 18, 19A, and 19B are views for explaining the method of fabricating the display device according to one or more embodiments. FIGS. 20 through 22 are views showing a sintered state of metal particles of a side wiring according to laser energy.

The method of fabricating the display device according to one or more embodiments will now be described with reference to FIGS. 12 through 18, 19A, 19B, and 20 through 22.

First, a plurality of side wirings SIL respectively connecting first pads PD1 and second pads PD2 of a display panel 100 are printed (operation S110 in FIG. 12).

The side wirings SIL are formed by rubbing a metal paste including metal particles MP, monomers MOM, and a solvent SOL as illustrated in FIG. 20 onto a first surface FS, a second surface BS, at least any two of a plurality of chamfered surfaces CS1 through CS8, and at least any one of a plurality of side surfaces SS1 through SS4 of a substrate SUB by using a silicon pad. The metal paste may include about 70 to 80 wt % of metal particles MP, about 10 wt % of monomers MOM, and about 10 to 20 wt % of solvent SOL.

The metal particles MP may be metals such as silver (Ag) and/or copper (Cu). The monomers MOM may have an epoxy group chain and/or an acryl group chain. The solvent SOL may be an ethanol-based material, an ether-based material, and/or an alcohol-based material, but embodiments of the present specification are not limited thereto.

Figure 19A:
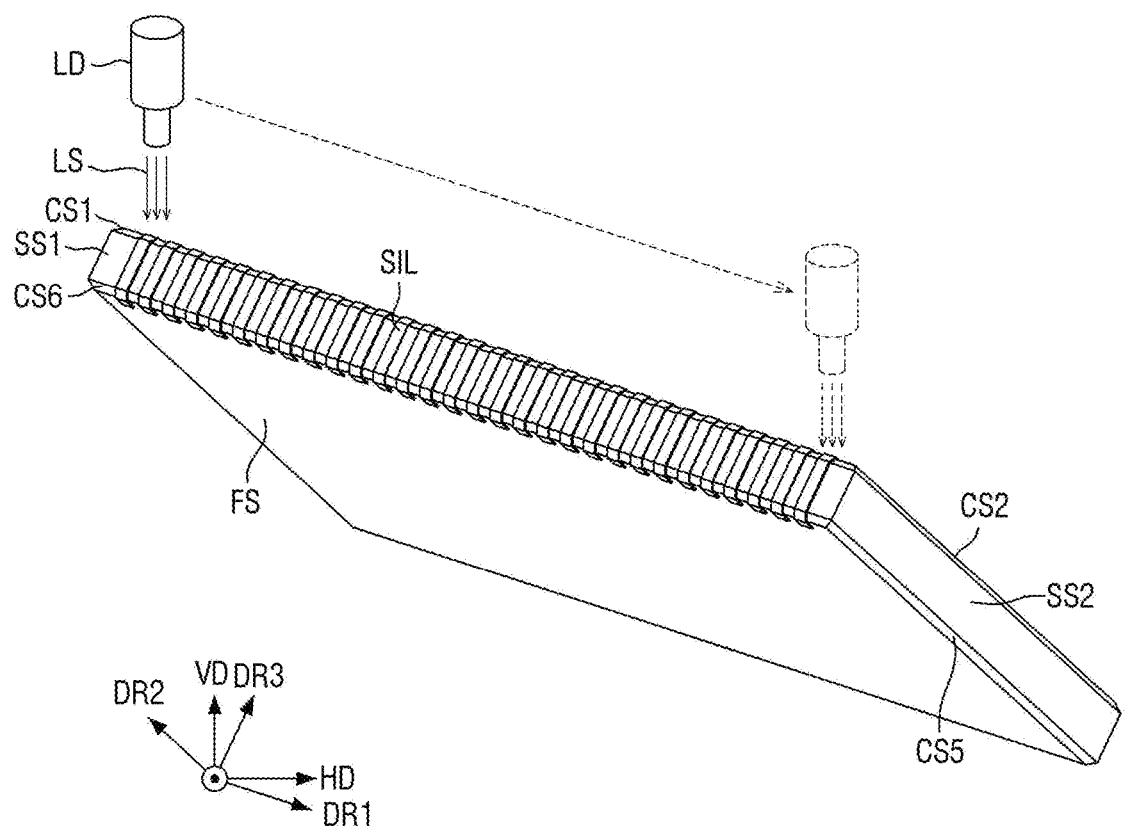

Second, as illustrated in FIG. 19A, the display panel 100 is tilted at about 135 degrees with respect to a horizontal direction HD (operation S120 in FIG. 12).

The first surface FS of the substrate SUB may be tilted at about 135 degrees with respect to the horizontal direction HD. In this case, a fifth portion BSP and a third portion SSP of each of the side wirings SIL may be visible from a laser device LD provided in a vertical direction VD of the display panel 100. For example, the substrate SUB may be aligned such that the laser device LD can irradiate a laser LR to the fifth portion BSP and the third portion SSP of each of the side wirings SIL.

Figure 14:
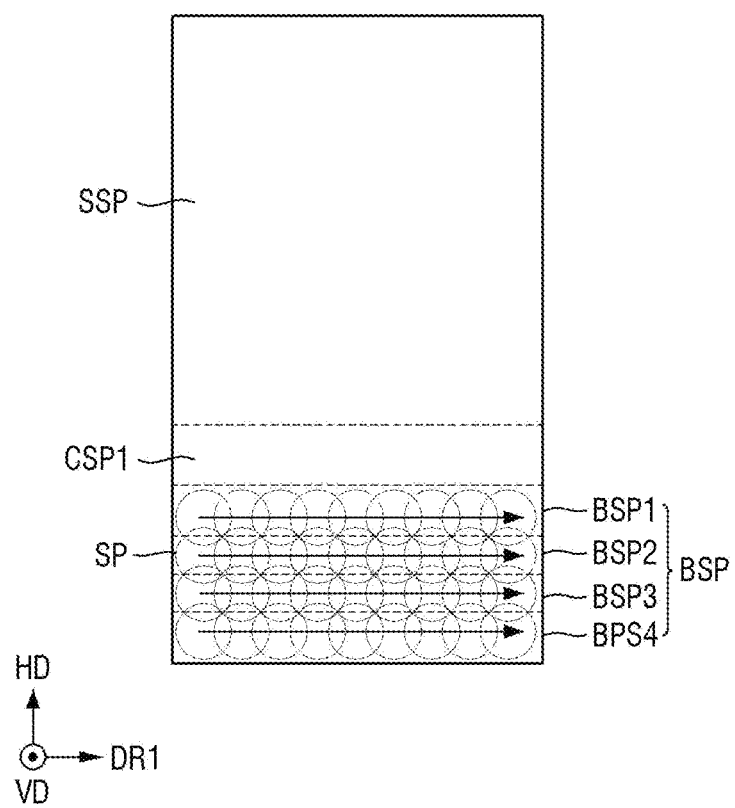

Third, as illustrated in FIGS. 13 and 14, a laser is irradiated to the fifth portion BSP of each of the side wirings SIL (operation S130 in FIG. 12).

An angle formed by the second surface BS of the substrate SUB on which the fifth portion BSP of each side wiring SIL is provided and the laser LR irradiated from the laser device LD may be about 45 degrees. Then, the laser device LD may be placed to overlap the fifth portion BSP of each side wiring SIL in the vertical direction VD. The laser device LD may irradiate the laser LR to the fifth portion BSP of each side wiring SIL.

The laser device LD may emit an infrared laser LR in the range of about 980 to 1064 nm to the fifth portion BSP. The laser device LD may irradiate the laser LR to the fifth portion BSP at a power of 0.9 to 1.1 W and a repetition rate of 60 to 90 kHz, but embodiments of the present specification are not limited thereto.

As illustrated in FIG. 21, monomers MOM of the fifth portion BSP of each side wiring SIL may be changed to a polymer by a radical polymerization reaction due to the heat of the laser LR. Accordingly, metal particles may be more closely packed and agglomerated with each other. For example, when the monomers MOM of the fifth portion BSP of each side wiring SIL are changed to a polymer POM, their length may become shorter, thus reducing a distance between the metal particles MP in the fifth portion BSP. Accordingly, the metal particles MP of the fifth portion BSP of each side wiring SIL may be more closely packed and agglomerated with each other.

However, as illustrated in FIG. 22, when the energy of the laser LR irradiated to the fifth portion BSP of each side wiring SIL is too high, the polymer POM may be decomposed, and the resulting outgas may generate bubbles BUB. This may weaken cohesion between the metal particles, thus increasing the resistivity of the fifth portion BSP.

The fifth portion BSP of each side wiring SIL may include a plurality of laser irradiation areas BSP1 through BSP4 as illustrated in FIG. 14. The laser irradiation areas BSP1 through BSP4 of the fifth portion BSP may be determined by the size of a spot of the laser LR. The size of the spot of the laser LR may be about 100 μm. In the fifth portion BSP, laser irradiation areas adjacent to each other in the horizontal direction HD may overlap each other.

For example, the fifth portion BSP may include first through fourth laser irradiation areas BSP1 through BSP4.

The laser device LD may sequentially irradiate the laser LR to the first through fourth laser irradiation areas BSP1 through BSP4 of the fifth portion BSP. First, the laser device LD may irradiate the laser LR while moving in the first laser irradiation area BSP1 of the fifth portion BSP in the first direction DR1 and then may irradiate the laser LR while moving in the second laser irradiation area BSP2 in the first direction DR1. Next, the laser device LD may irradiate the laser LR while moving in the third laser irradiation area BSP3 of the fifth portion BSP in the first direction DR1, and then may irradiate the laser LR while moving in the fourth laser irradiation area BSP4 in the first direction DR1. In this case, spots SP of the laser LR neighboring each other in the first direction DR1 may overlap each other.

Figure 15:
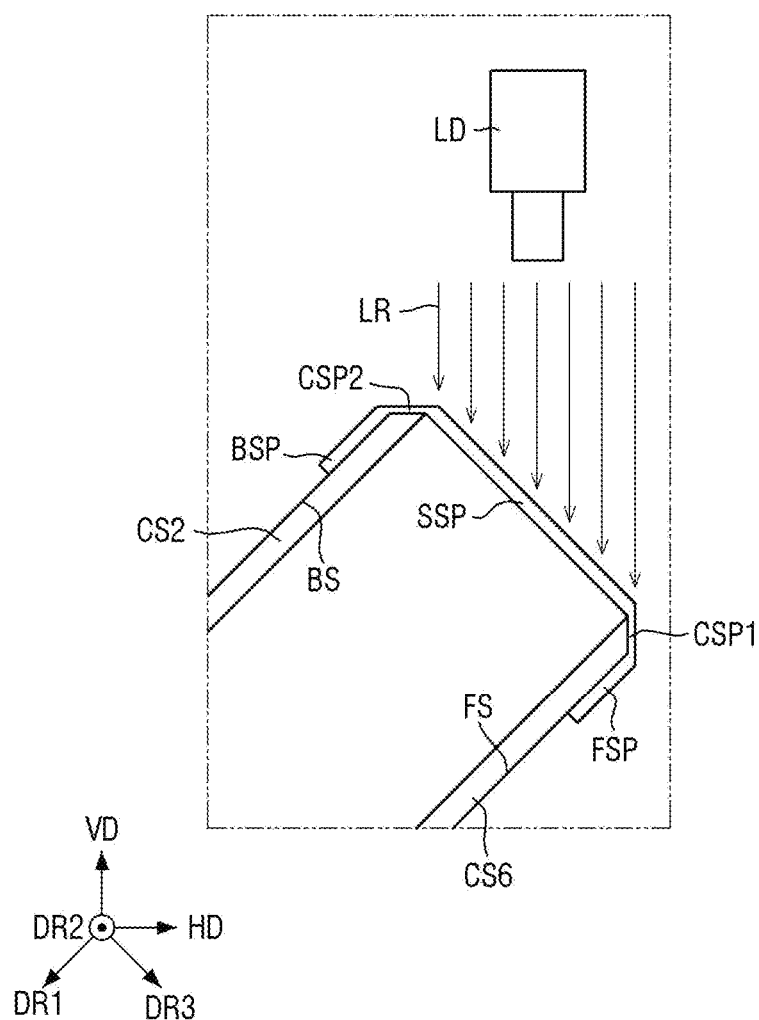
Figure 16:
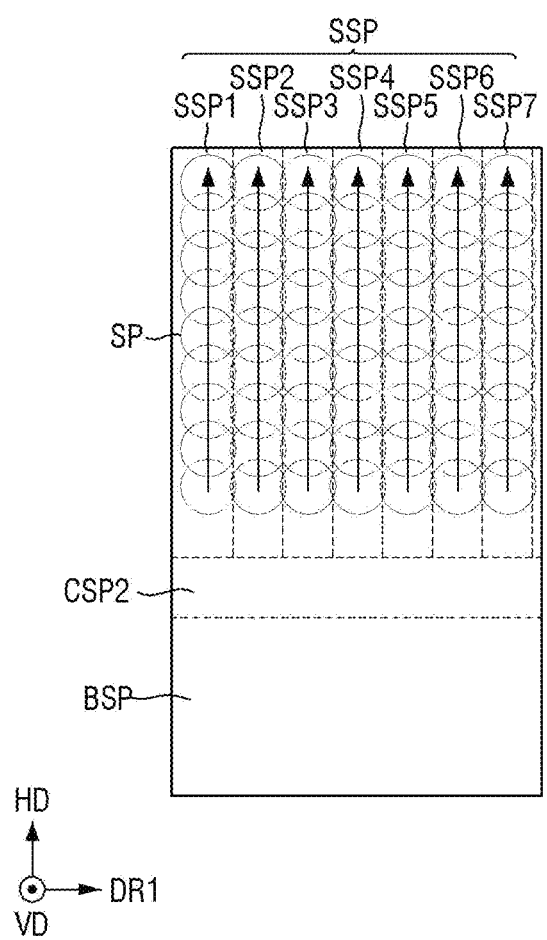

Fourth, as illustrated in FIGS. 15 and 16, a laser is irradiated to the third portion SSP of each of the side wirings SIL (operation S140 in FIG. 12).

An angle formed by a first side surface SS1 of the substrate SUB on which the third portion SSP of each side wiring SIL is provided and the laser LR irradiated from the laser device LD may be about 45 degrees. The laser device LD may be placed to overlap the third portion SSP of each side wiring SIL in the vertical direction VD. The laser device LD irradiates the laser LR to the third portion SSP of each side wiring SIL.

The laser device LD may emit an infrared laser LR in the range of about 980 to 1064 nm to the third portion SSP. The laser device LD may irradiate the laser LR to the third portion SSP at a power of 0.9 to 1.1 W and a repetition rate of 60 to 90 kHz, but embodiments of the present specification are not limited thereto. The power, repetition rate, spot size, and spot overlap ratio of the laser irradiated to the third portion SSP of each side wiring SIL may be substantially the same as the power, repetition rate, spot size, and spot overlap ratio of the laser irradiated to the fifth portion BSP of each side wiring SIL.

Monomers of the third portion SSP of each side wiring SIL may be changed to a polymer by a radical polymerization reaction due to the heat of the laser LR. Accordingly, metal particles may be more closely packed and agglomerated with each other. For example, when the monomers of the third portion SSP of each side wiring SIL are changed to a polymer, their length may become shorter, thus reducing a distance between the metal particles in the third portion SSP. Accordingly, the metal particles of the third portion SSP of each side wiring SIL may be more closely packed and agglomerated with each other.

The third portion SSP of each side wiring SIL may include a plurality of laser irradiation areas SSP1 through SSP7 as illustrated in FIG. 16. The laser irradiation areas SSP1 through SSP7 of the third portion SSP may be determined by the size of a spot SP of the laser LR. The size of the spot of the laser LR may be about 100 μm.

In the third portion SSP, laser irradiation areas neighboring each other in the first direction DR1 may overlap each other. An overlap ratio of laser irradiation areas neighboring each other in the third portion SSP may be smaller than an overlap ratio of laser irradiation areas neighboring each other in the fifth portion BSP. For example, because the proportion of an area to which the laser LR is repeatedly irradiated in neighboring laser irradiation areas is greater in the fifth portion BSP than in the third portion SSP, the energy of the laser LR irradiated to the fifth portion BSP may be greater than the energy of the laser LR irradiated to the third portion SSP.

For example, the third portion SSP may include first through seventh laser irradiation areas SSP1 through SSP7.

The laser device LD may sequentially irradiate the laser LR to the first through seventh laser irradiation areas SSP1 through SSP7 of the third portion BSP. First, the laser device LD may irradiate the laser LR while moving in the first laser irradiation area SSP1 of the third portion SSP in the horizontal direction HD and then may irradiate the laser LR while moving in the second laser irradiation area SSP2 in the horizontal direction HD. Next, the laser device LD may irradiate the laser LR while moving in the third laser irradiation area SSP3 of the third portion SSP in the horizontal direction HD and then may irradiate the laser LR while moving in the fourth laser irradiation area SSP4 in the horizontal direction HD. Next, the laser device LD may irradiate the laser LR while moving in the fifth laser irradiation area SSP5 of the third portion SSP in the horizontal direction HD and then may irradiate the laser LR while moving in the sixth laser irradiation area SSP6 in the horizontal direction HD. Finally, the laser device LD may radiate the laser LR while moving in the seventh laser irradiation area SSP7 of the third portion SSP in the horizontal direction HD.

In the third portion SSP, spots SP of the laser LR neighboring each other in the horizontal direction HD may overlap each other. An overlap ratio of the spots SP of the laser LR neighboring each other in the third portion SSP in the horizontal direction HD may be substantially the same as an overlap ratio of the spots SP of the laser LR neighboring each other in the fifth portion BSP in the first direction DR1.

Fifth, as illustrated in FIG. 19B, the display panel 100 is tilted at about 45 degrees with respect to the horizontal direction HD (operation S150 in FIG. 12).

The first surface FS of the substrate SUB may be tilted at about 45 degrees with respect to the horizontal direction HD. In this case, a first portion FSP and the third portion SSP of each of the side wirings SIL may be visible from the laser device LD provided in the vertical direction VD of the display panel 100. For example, the substrate SUB may be aligned such that the laser device LD can irradiate the laser LR to the first portion FSP of each of the side wirings SIL.

Figure 17:
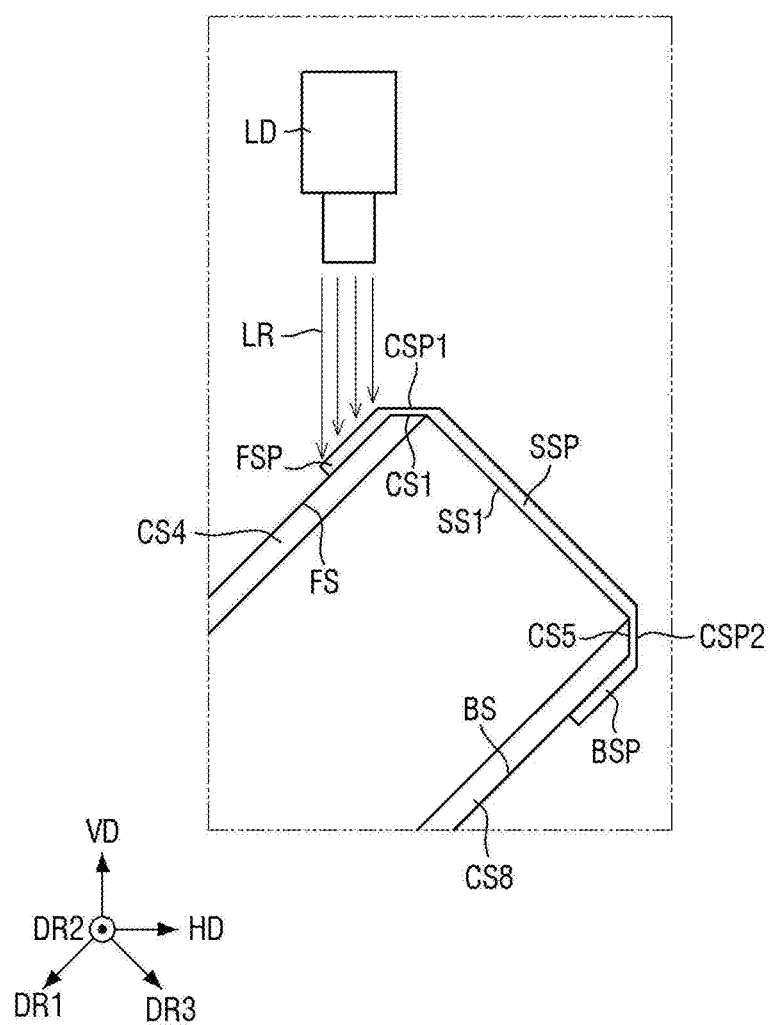
Figure 18:
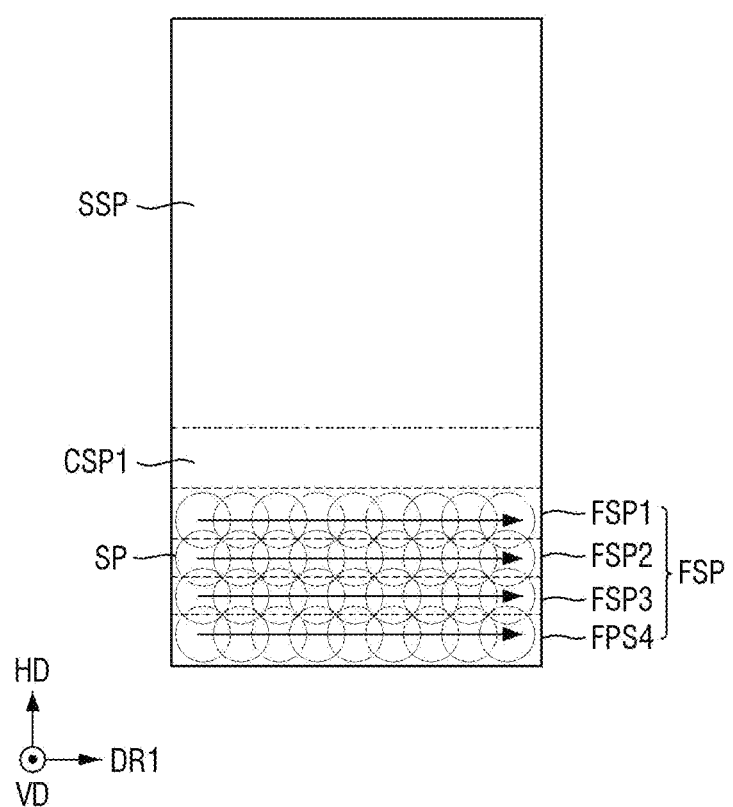

Third, as illustrated in FIGS. 17 and 18, a laser is irradiated to the first portion FSP of each of the side wirings SIL (operation S120 in FIG. 12).

An angle formed by the first surface FS of the substrate SUB on which the first portion FSP of each side wiring SIL is provided and the laser LR irradiated from the laser device LD may be about 45 degrees. Then, the laser device LD may be placed to overlap the first portion FSP of each side wiring SIL in the vertical direction VD. The laser device LD may irradiate the laser LR to the first portion FSP of each side wiring SIL.

The laser device LD may emit an infrared laser LR in the range of about 980 to 1064 nm to the first portion FSP. The laser device LD may irradiate the laser LR to the first portion FSP at a power of 0.9 to 1.1 W and a repetition rate of 60 to 90 kHz, but embodiments of the present specification are not limited thereto. The power, repetition rate, spot size, and spot overlap ratio of the laser irradiated to the first portion FSP of each side wiring SIL may be substantially the same as the power, repetition rate, spot size, and spot overlap ratio of the laser irradiated to the fifth portion BSP of each side wiring SIL.

Monomers of the first portion FSP of each side wiring SIL may be changed to a polymer by a radical polymerization reaction due to the heat of the laser LR. Accordingly, metal particles may be more closely packed and agglomerated with each other. For example, when the monomers of the first portion FSP of each side wiring SIL are changed to a polymer, their length may become shorter, thus reducing a distance between the metal particles in the first portion FSP. Accordingly, the metal particles of the first portion FSP of each side wiring SIL may be more closely packed and agglomerated with each other.

The first portion FSP of each side wiring SIL may include a plurality of laser irradiation areas FSP1 through FSP4 as illustrated in FIG. 18. The laser irradiation areas FSP1 through FSP4 of the first portion FSP may be determined by the size of a spot of the laser LR. The size of the spot of the laser LR may be about 100 μm. In the first portion FSP, laser irradiation areas neighboring each other in the horizontal direction HD may overlap each other.

In the first portion FSP, laser irradiation areas neighboring each other in the first direction DR1 may overlap each other. An overlap ratio of laser irradiation areas neighboring each other in the first portion FSP may be greater than an overlap ratio of laser irradiation areas neighboring each other in the third portion SSP. For example, because the proportion of an area to which the laser LR is repeatedly irradiated in neighboring laser irradiation areas is greater in the first portion FSP than in the third portion SSP, the energy of the laser LR irradiated to the first portion FSP may be greater than the energy of the laser LR irradiated to the third portion SSP.

For example, the first portion FSP may include first through fourth laser irradiation areas FSP1 through FSP4. The laser device LD may sequentially irradiate the laser LR to the first through fourth laser irradiation areas FSP1 through FSP4 of the first portion FSP. First, the laser device LD may irradiate the laser LR while moving in the first laser irradiation area FSP1 of the first portion FSP in the first direction DR1 and then may irradiate the laser LR while moving in the second laser irradiation area FSP2 in the first direction DR1. Next, the laser device LD may irradiate the laser LR while moving in the third laser irradiation area FSP3 of the first portion FSP in the first direction DR1 and then may irradiate the laser LR while moving in the fourth laser irradiation area FSP4 in the first direction DR1.

In the first portion FSP, spots SP of the laser LR neighboring each other in the first direction DR1 may overlap each other. An overlap ratio of the spots SP of the laser LR neighboring each other in the first portion FSP in the first direction DR1 may be substantially the same as an overlap ratio of the spots SP of the laser LR neighboring each other in the fifth portion BSP in the first direction DR1.

As described above, the overlap ratio of laser irradiation areas neighboring each other in the first portion FSP and the overlap ratio of laser irradiation areas neighboring each other in the fifth portion BSP may be higher than the overlap ratio of laser irradiation areas neighboring each other in the third portion SSP. Accordingly, although the power, repetition rate, spot size, and spot overlap ratio of the laser irradiated to each of the first portion FSP, the third portion SSP, and the fifth portion BSP are substantially the same, the energy of the laser transmitted to the first portion FSP and the fifth portion BSP may be higher than the energy of the laser transmitted to the third portion SSP. Therefore, in the first portions FSP connected to the first pads PD1, the metal particles of the side wirings SIL may be closely packed together, thereby lowering resistivity and reducing contact resistance between the side wirings SIL and the first pads PD1. In addition, in the fifth portions BSP connected to the second pads PD2, the metal particles of the side wirings SIL may be closely packed together, thereby lowering resistivity and reducing contact resistance between the side wirings SIL and the second pads PD2.

In addition, in each side wiring SIL, a thickness of a second portion CSP1 provided on a first chamfered surface CS1 and a thickness of a fourth portion CSP2 provided on a fifth chamfered surface CS5 may be smaller than a thickness of the first portion FSP, a thickness of the third portion SSP, and a thickness of the fifth portion BSP. Therefore, when irradiated with the laser LR, the second portion CSP1 and the fourth portion CSP2 of each side wiring SIL are highly likely to be damaged by the energy of the laser LR. In one or more embodiments, a sintering process using a laser is not performed on the second portion CSP1 and the fourth portion CSP2 of each side wiring SIL.

In one or more embodiments of the present specification, the laser LR is irradiated to the fifth portions BSP of the side wirings SIL, to the third portions SSP of the side wirings SIL, and then to the first portions FSP of the side wirings SIL. However, embodiments of the present specification are not limited thereto. For example, the laser LR may also be irradiated to the fifth portion BSP and the third portion SSP of each side wiring SIL and then to the first portion FSP of each side wiring SIL.

Figure 23:
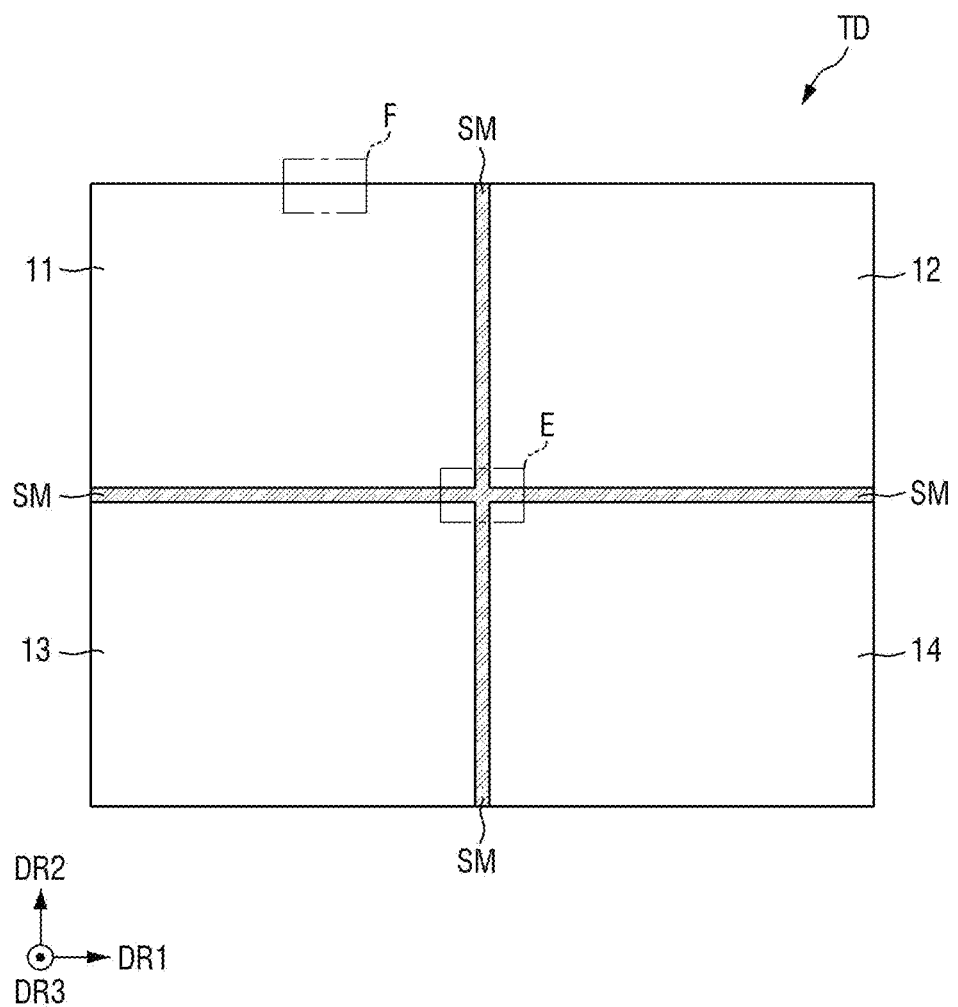
FIG. 23 is a plan view of a tiled display device according to one or more embodiments.

FIG. 23 is a plan view of a tiled display device TD according to one or more embodiments.

Referring to FIG. 23, the tiled display device TD may include a plurality of display devices 11 through 14 and a seam SM. For example, the tiled display device TD may include a first display device 11, a second display device 12, a third display device 13, and a fourth display device 14.

The display devices 11 through 14 may be arranged in a grid shape. The display devices 11 through 14 may be arranged in a matrix of M (where M is a positive integer) rows and N (where N is a positive integer) columns. For example, the first display device 11 and the second display device 12 may neighbor each other in the first direction DR1. The first display device 11 and the third display device 13 may neighbor each other in the second direction DR2. The third display device 13 and the fourth display device 14 may neighbor each other in the first direction DR1. The second display device 12 and the fourth display device 14 may neighbor each other in the second direction DR2.

However, the number and arrangement of the display devices 11 through 14 in the tiled display device TD are not limited to those illustrated in FIG. 23. The number and arrangement of the display devices 11 through 14 in the tiled display device TD may be determined by the size of each of the display devices 11 through 14 and the tiled display device TD and the shape of the tiled display device TD.

The display devices 11 through 14 may have the same size, but embodiments of the present specification are not limited thereto. For example, the display devices 11 through 14 may also have different sizes.

Each of the display devices 11 through 14 may be shaped like a rectangle including long sides and short sides. The long sides or short sides of the display devices 11 through 14 may be connected to each other. Some or all of the display devices 11 through 14 may be provided at an edge of the tiled display device TD and may form a side of the tiled display device TD. At least one of the display devices 11 through 14 may be provided at at least one corner of the tiled display device TD and may form two adjacent sides of the tiled display device TD. At least one of the display devices 11 through 14 may be surrounded by other display devices.

Each of the display devices 11 through 14 may be substantially the same as the display device 10 described above with reference to FIGS. 1A and 1B. Therefore, a redundant description of each of the display devices 11 through 14 will not be provided.

The seam SM may include a coupling member and/or an adhesive member. In this case, the display devices 11 through 14 may be connected to each other through the coupling member and/or the adhesive member of the seam SM. The seam SM may be provided between the first display device 11 and the second display device 12, between the first display device 11 and the third display device 13, between the second display device 12 and the fourth display device 14, and between the third display device 13 and the fourth display device 14.

Figure 24:
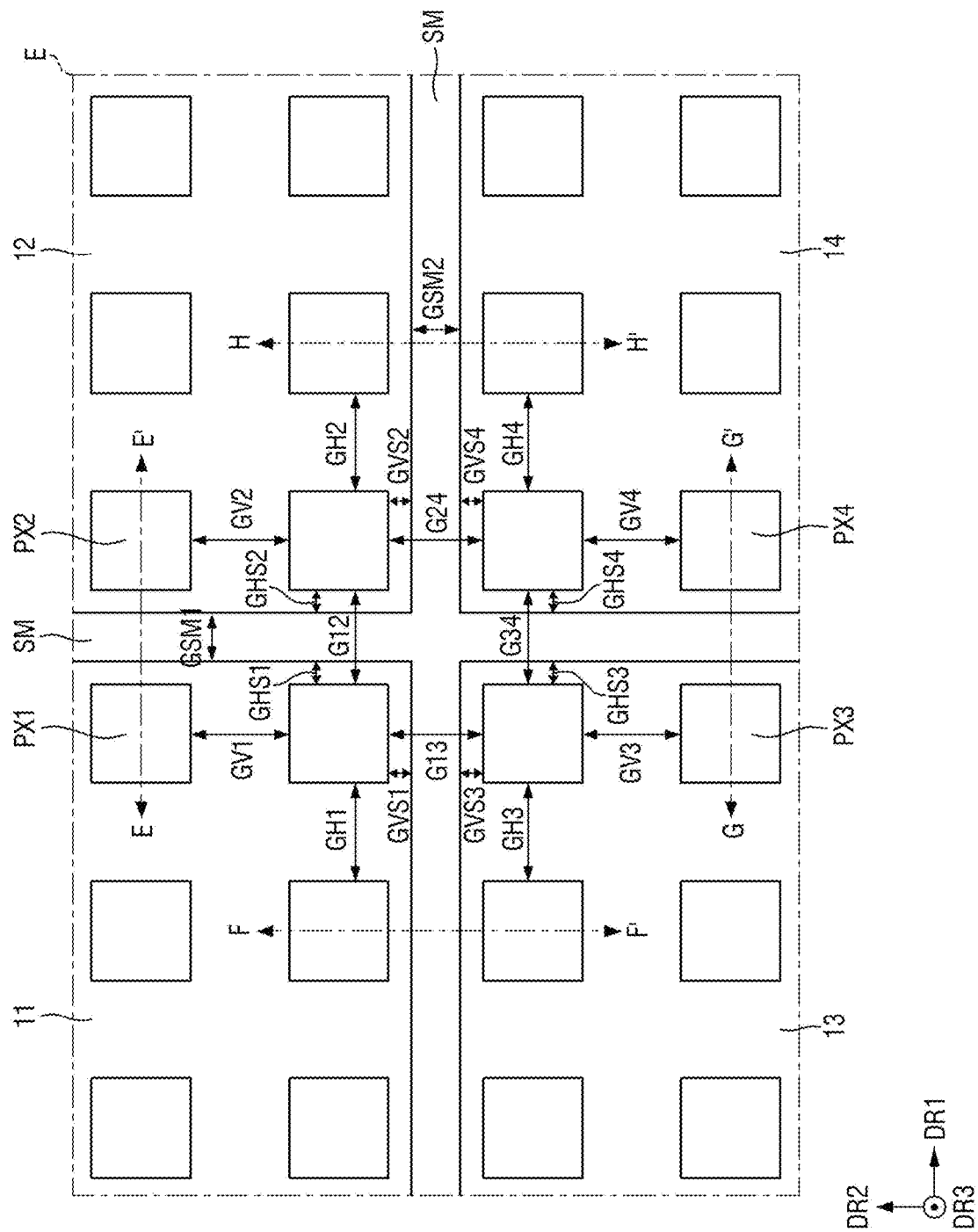
FIG. 24 is an enlarged layout view illustrating area E of FIG. 23 in more detail.

FIG. 24 is an enlarged layout view illustrating area E of FIG. 23 in more detail.

Referring to FIG. 24, the seam SM may have a planar shape of a cross or a plus sign in a central area of the tiled display device TD in which the first display device 11, the second display device 12, the third display device 13, and the fourth display device 14 are adjacent to each other. The seam SM may be provided between the first display device 11 and the second display device 12, between the first display device 11 and the third display device 13, between the second display device 12 and the fourth display device 12, and between the third display device 13 and the fourth display device 14.

The first display device 11 may include first pixels PX1 arranged in a matrix in the first direction DR1 and the second direction DR2 to display an image. The second display device 12 may include second pixels PX2 arranged in a matrix in the first direction DR1 and the second direction DR2 to display an image. The third display device 13 may include third pixels PX3 arranged in a matrix in the first direction DR1 and the second direction DR2 to display an image. The fourth display device 14 may include fourth pixels PX4 arranged in a matrix in the first direction DR1 and the second direction DR2 to display an image.

A minimum distance between the first pixels PX1 neighboring in the first direction DR1 may be defined as a first horizontal separation distance GH1, and a minimum distance between the second pixels PX2 neighboring in the first direction DR1 may be defined as a second horizontal separation distance GH2. The first horizontal separation distance GH1 and the second horizontal separation distance GH2 may be substantially the same.

The seam SM may be provided between the first pixels PX1 and the second pixels PX2 neighboring in the first direction DR1. A minimum distance G12 between the first pixels PX1 and the second pixels PX2 neighboring in the first direction DR1 may be the sum of a minimum distance GHS1 between the first pixels PX1 most adjacent to the seam SM and the seam SM in the first direction DR1, a minimum distance GHS2 between the second pixels PX2 most adjacent to the seam SM and the seam SM in the first direction DR1, and a width GSM1 of the seam SM in the first direction DR1.

The minimum distance G12 between the first pixels PX1 and the second pixels PX2 neighboring in the first direction DR1, the first horizontal separation distance GH1, and the second horizontal separation distance GH2 may be substantially the same. The minimum distance GHS1 between the first pixels PX1 and the seam SM in the first direction DR1 may be smaller than the first horizontal separation distance GH1, and the minimum distance GHS2 between the second pixels PX2 and the seam SM in the first direction DR1 may be smaller than the second horizontal separation distance GH2. In addition, the width GSM1 of the seam SM in the first direction DR1 may be smaller than the first horizontal separation distance GH1 or the second horizontal separation distance GH2.

A minimum distance between the third pixels PX3 neighboring in the first direction DR1 may be defined as a third horizontal separation distance GH3, and a minimum distance between the fourth pixels PX4 neighboring in the first direction DR1 may be defined as a fourth horizontal separation distance GH4. The third horizontal separation distance GH3 and the fourth horizontal separation distance GH4 may be substantially the same.

The seam SM may be provided between the third pixels PX3 and the fourth pixels PX4 neighboring in the first direction DR1. A minimum distance G34 between the third pixels PX3 and the fourth pixels PX4 neighboring in the first direction DR1 may be the sum of a minimum distance GHS3 between the third pixels PX3 most adjacent to the seam SM and the seam SM in the first direction DR1, a minimum distance GHS4 between the fourth pixels PX4 most adjacent to the seam SM and the seam SM in the first direction DR1, and the width GSM1 of the seam SM in the first direction DR1.

The minimum distance G34 between the third pixels PX3 and the fourth pixels PX4 neighboring in the first direction DR1, the third horizontal separation distance GH3, and the fourth horizontal separation distance GH4 may be substantially the same. The minimum distance GHS3 between the third pixels PX3 and the seam SM in the first direction DR1 may be smaller than the third horizontal separation distance GH3, and the minimum distance GHS4 between the fourth pixels PX4 and the seam SM in the first direction DR1 may be smaller than the fourth horizontal separation distance GH4. In addition, the width GSM1 of the seam SM in the first direction DR1 may be smaller than the third horizontal separation distance GH3 or the fourth horizontal separation distance GH4.

A minimum distance between the first pixels PX1 neighboring in the second direction DR2 may be defined as a first vertical separation distance GV1, and a minimum distance between the third pixels PX3 neighboring in the second direction DR2 may be defined as a third vertical separation distance GV3. The first vertical separation distance GV1 and the third vertical separation distance GV3 may be substantially the same.

The seam SM may be provided between the first pixels PX1 and the third pixels PX3 neighboring in the second direction DR2. A minimum distance G13 between the first pixels PX1 and the third pixels PX3 neighboring in the second direction DR2 may be the sum of a minimum distance GVS1 between the first pixels PX1 most adjacent to the seam SM and the seam SM in the second direction DR2, a minimum distance GVS3 between the third pixels PX3 most adjacent to the seam SM and the seam SM in the second direction DR2, and a width GSM2 of the seam SM in the second direction DR2.

The minimum distance G13 between the first pixels PX1 and the third pixels PX3 neighboring in the second direction DR2, the first vertical separation distance GV1, and the third vertical separation distance GV3 may be substantially the same. The minimum distance GVS1 between the first pixels PX1 and the seam SM in the second direction DR2 may be smaller than the first vertical separation distance GV1, and the minimum distance GVS3 between the third pixels PX3 and the seam SM in the second direction DR2 may be smaller than the third vertical separation distance GV3. In addition, the width GSM2 of the seam SM in the second direction DR2 may be smaller than the first vertical separation distance GV1 or the third vertical separation distance GV3.

A minimum distance between the second pixels PX2 neighboring in the second direction DR2 may be defined as a second vertical separation distance GV2, and a minimum distance between the fourth pixels PX4 neighboring in the second direction DR2 may be defined as a fourth vertical separation distance GV4. The second vertical separation distance GV2 and the fourth vertical separation distance GV4 may be substantially the same.

The seam SM may be provided between the second pixels PX2 and the fourth pixels PX4 neighboring in the second direction DR2. A minimum distance G24 between the second pixels PX2 and the fourth pixels PX4 neighboring in the second direction DR2 may be the sum of a minimum distance GVS2 between the second pixels PX2 most adjacent to the seam SM and the seam SM in the second direction DR2, a minimum distance GVS4 between the fourth pixels PX4 most adjacent to the seam SM and the seam SM in the second direction DR2, and the width GSM2 of the seam SM in the second direction DR2.

The minimum distance G24 between the second pixels PX2 and the fourth pixels PX4 neighboring in the second direction DR2, the second vertical separation distance GV2, and the fourth vertical separation distance GV4 may be substantially the same. The minimum distance GVS2 between the second pixels PX2 and the seam SM in the second direction DR2 may be smaller than the second vertical separation distance GV2, and the minimum distance GVS4 between the fourth pixels PX4 and the seam SM in the second direction DR2 may be smaller than the fourth vertical separation distance GV4. In addition, the width GSM2 of the seam SM in the second direction DR2 may be smaller than the second vertical separation distance GV2 or the fourth vertical separation distance GV4.

As illustrated in FIG. 24, in order to prevent or reduce the recognition (e.g., visibility to the user) of the seam SM between images displayed by the display devices 11 through 14, the minimum distance between pixels of neighboring display devices may be substantially the same as the minimum distance between pixels within each of the display devices.

Figure 25:
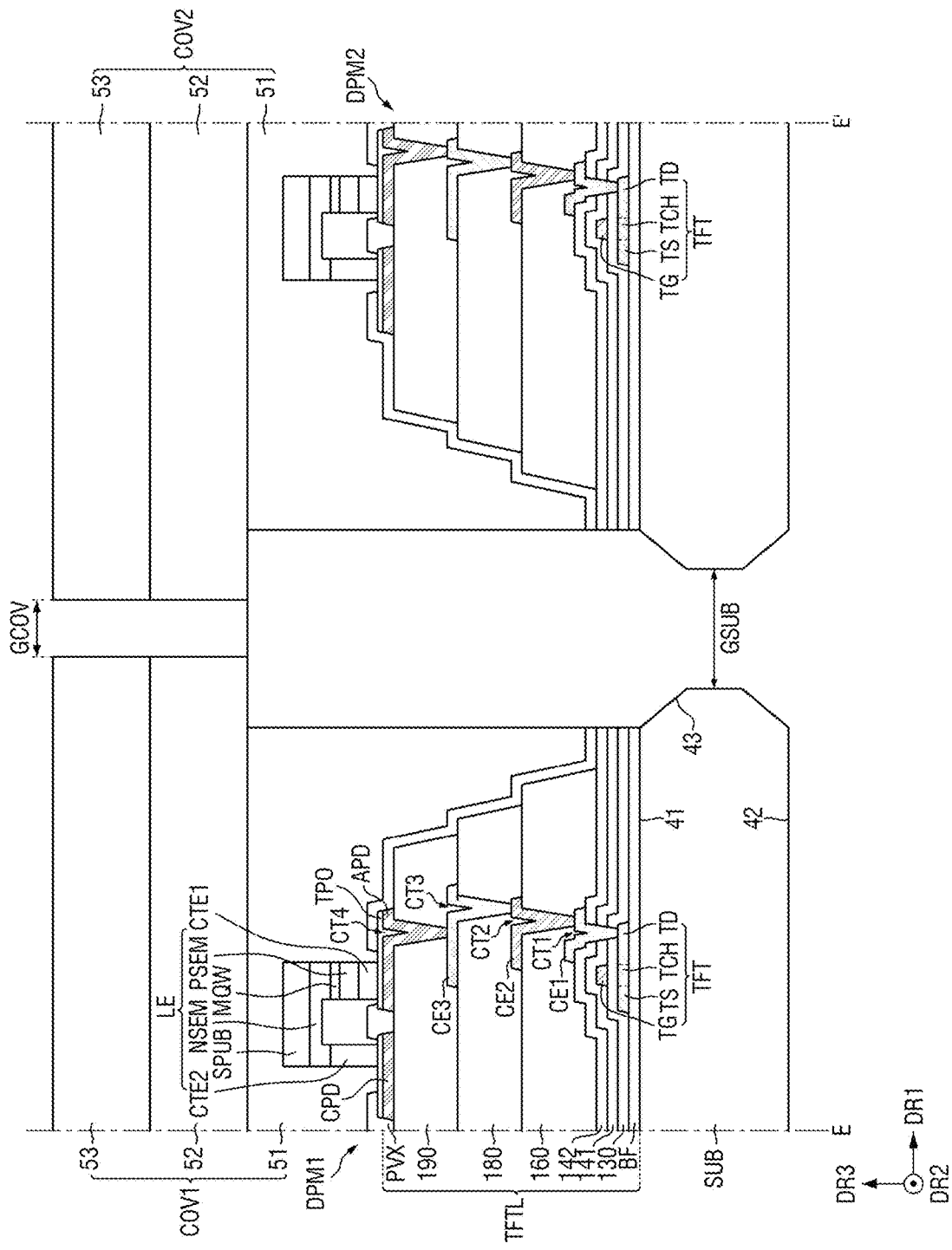
FIG. 25 is a cross-sectional view of an example of the tiled display device taken along line E-E' of FIG. 24.

FIG. 25 is a cross-sectional view of an example of the tiled display device TD taken along line E-E' of FIG. 24.

Referring to FIG. 25, the first display device 11 includes a first display module DPM1 and a first front cover COV1. The second display device 12 includes a second display module DPM2 and a second front cover COV2.

Each of the first display module DPM1 and the second display module DPM2 includes a substrate SUB, a thin-film transistor layer TFTL, and light emitting elements LE. The thin-film transistor layer TFTL and the light emitting elements LE have already been described in detail with reference to FIGS. 10 and 11. In FIG. 25, descriptions overlapping those of one or more embodiments of FIGS. 10 and 11 will not be provided.

The substrate SUB may include a first surface 41 on which the thin-film transistor layer TFTL is provided, a second surface 42 facing the first surface 41, and a first side surface 43 provided between the first surface 41 and the second surface 42. The first surface 41 may be a front surface or an upper surface of the substrate SUB, and the second surface 42 may be a rear surface or a lower surface of the substrate SUB.

The first front cover COV1 may be provided on the substrate SUB. For example, the first front cover COV1 may protrude further than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 provided on the adhesive member 51, and an anti-glare layer 53 provided on the light transmittance control layer 52.

The adhesive member 51 of the first front cover COV1 attaches a light emitting element layer of the first display module DPM1 to the first front cover COV1. The adhesive member 51 of the second front cover COV2 attaches a light emitting element layer of the second display module DPM2 to the second front cover COV2. The adhesive member 51 may be a transparent adhesive member capable of transmitting light. For example, the adhesive member 51 may be an optically clear adhesive film and/or an optically clear resin.

The anti-glare layer 53 may be designed to diffusely reflect external light to prevent or reduce deterioration of image visibility due to the external light being reflected as it is. Accordingly, a contrast ratio of images displayed by the first display device 11 and the second display device 12 may be increased (or improved) due to the anti-glare layer 53.

The light transmittance control layer 52 may be designed to reduce transmittance of external light or light reflected from the first display module DPM1 and the second display module DPM2. Accordingly, the recognition from the outside (e.g., visibility to the user) of the distance GSUB between the substrate SUB of the first display module DPM1 and the substrate SUB of the second display module DPM2 may be prevented or reduced.

The anti-glare layer 53 may be implemented as a polarizing plate, and the light transmittance control layer 52 may be implemented as a phase delay layer, but embodiments of the present specification are not limited thereto.

An example of the tiled display device TD cut along lines F-F', G-G', and H-H' of FIG. 24 is substantially the same as the example of the tiled display device TD cut along line E-E' described above with reference to FIG. 25, and thus a redundant description thereof will not be provided.

Figure 26:
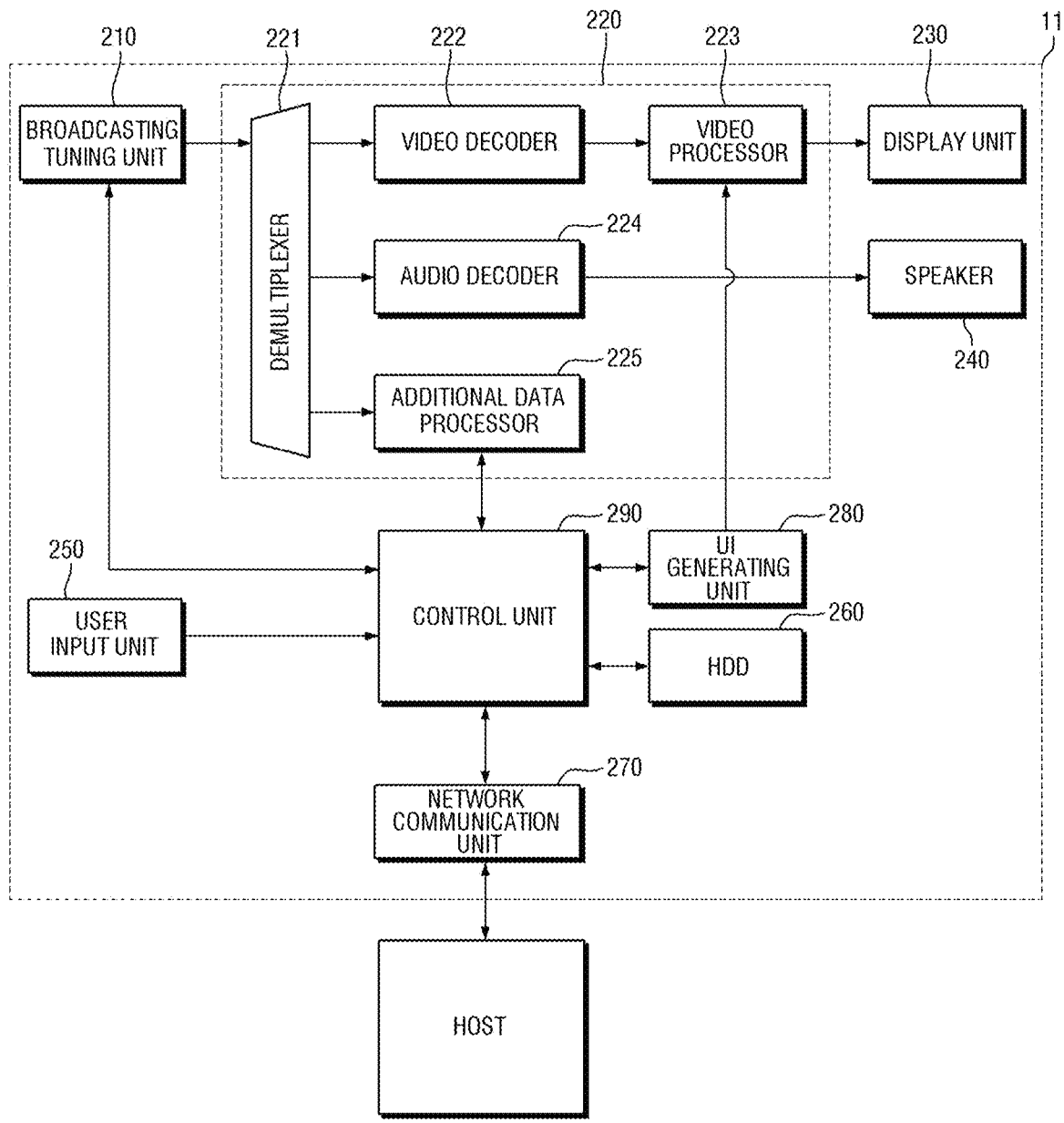
FIG. 26 is a block diagram of the tiled display device according to one or more embodiments.

FIG. 26 is a block diagram of the tiled display device TD according to one or more embodiments of FIG. 23.

In FIG. 26, the first display device 11 and a host system HOST are illustrated for ease of description.

Referring to FIG. 26, the tiled display device TD according to one or more embodiments may include the host system HOST, a broadcast tuning unit 210, a signal processing unit 220, a display unit 230, a speaker 240, a user input unit 250, a hard disk drive (HDD) 260, a network communication unit 270, a user interface (UI) generating unit 280, and a control unit 290.

The host system HOST may be implemented as any one of a television system, a home theater system, a set-top box, a navigation system, a DVD player, a Blu-ray player, a PC, a mobile phone system, and/or a tablet.

A user's command may be input to the host system HOST in one or more suitable forms. For example, the user's command may be input to the host system HOST through a touch input. In some embodiments, the user's command may be input to the host system HOST through a keyboard input or a button input of a remote controller.

The host system HOST may receive original video data corresponding to an original image from the outside. The host system HOST may divide the original video data by the number of display devices. For example, for the first display device 11, the second display device 12, the third display device 13, and the fourth display device 14, the host system HOST may divide the original video data into first video data corresponding to a first image, second video data corresponding to a second image, third video data corresponding to a third image, and fourth video data corresponding to a fourth image. The host system HOST may transmit the first video data to the first display device 11, transmit the second video data to the second display device 12, transmit the third video data to the third display device 13, and transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, a user may view the original image into which the first through fourth images displayed on the first through fourth display devices 11 through 14 are combined.

The first display device 11 may include the broadcast tuning unit 210, the signal processing unit 220, the display unit 230, the speaker 240, the user input unit 250, the HDD 260, the network communication unit 270, the UI generating unit 280, and the control unit 290.

The broadcast tuning unit 210 may tune a set or predetermined channel frequency under the control of the control unit 290 and receive a broadcast signal of a corresponding channel through an antenna. The broadcast tuning unit 210 may include a channel detection module and a radio frequency (RF) demodulation module.

The broadcast signal demodulated by the broadcast tuning unit 210 is processed by the signal processing unit 220 and then output to the display unit 230 and the speaker 240. Here, the signal processing unit 220 may include a demultiplexer 221, a video decoder 222, a video processor 223, an audio decoder 224, and an additional data processor 225.

The demultiplexer 221 separates the demodulated broadcast signal into a video signal, an audio signal, and additional data. The video signal, the audio signal, and the additional data are restored by the video decoder 222, the audio decoder 224, and the additional data processor 225, respectively. Here, the video decoder 222, the audio decoder 224, and the additional data processor 225 restore the video signal, the audio signal, and the additional data in a decoding format corresponding to an encoding format used when the broadcast signal is transmitted.

The decoded video signal is converted by the video processor 223 to fit the vertical frequency, resolution, aspect ratio, etc. that meet the standard of the display unit 230, and the decoded audio signal is output to the speaker 240.

The display unit 230 includes a display panel 100 on which an image is displayed and a panel driver controlling driving of the display panel 100.

The user input unit 250 may receive a signal transmitted by the host system HOST. The user input unit 250 may be provided to allow a user to select commands regarding communication with other display devices 12 through 14 as well as data regarding channel selection and UI menu selection and manipulation transmitted by the host system HOST.

The HDD 260 stores various software programs including OS programs, recorded broadcast programs, moving images, photographs, and other data. The HDD 260 may be formed of a storage medium such as a hard disk and/or a non-volatile memory.

The network communication unit 270 is for short-distance communication with the host system HOST and other display devices 12 through 14. The network communication unit 270 can be implemented as a communication module including an antenna pattern that can implement mobile communication, data communication, Bluetooth, RF, Ethernet, etc.

The network communication unit 270 may transmit and receive wireless signals to and from at least one of a base station, an external terminal, and a server on a mobile communication network constructed according to technical standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.) through an antenna pattern to be described in more detail herein below.

The network communication unit 270 may also transmit and receive wireless signals in a communication network according to wireless Internet technologies through the antenna pattern to be described in more detail herein below. The wireless Internet technologies include, for example, Wireless LAN (WLAN), Wireless-Fidelity (Wi-Fi), Wi-Fi Direct, Digital Living Network Alliance (DLNA), Wireless Broadband (WiBro), World Interoperability for Microwave Access (WiMAX), HSDPA, HSUPA, LTE, and LTE-A. The antenna pattern transmits and receives data according to at least one wireless Internet technology within a suitable range including even Internet technologies not listed above.

The UI generating unit 280 generates a UI menu for communication with the host system HOST and other display devices 12 through 14 and can be implemented by an algorithm code and an on-screen display integrated circuit (OSD IC). The UI menu for communication with the host system HOST and other display devices 12 through 14 may be a menu for designating a desired digital television for communication and selecting a desired function.

The control unit 290 is responsible for overall control of the first display device 11 and responsible for communication control of the host system HOST and the second through fourth display devices 12 through 14. The control unit 290 can be implemented by a micro controller unit (MCU) which stores an algorithm code for control and executes the stored algorithm code.

The control unit 290 controls a control command and data corresponding to the input and selection of the user input unit 250 to be transmitted to the host system HOST and the second through fourth display devices 12 through 14 through the network communication unit 270. When a set or predetermined control command and data are received from the host system HOST and the second through fourth display devices 12 through 14, the control unit 290 performs an operation according to the control command.

It should be understood, however, that the aspects and features of embodiments of the present disclosure are not restricted to the one set forth herein. The above and other aspects of the present disclosure will become more apparent to one of ordinary skill in the art to which the present disclosure pertains by referencing the claims, with functional equivalents thereof to be included therein.

What is claimed is:

1. A display device comprising:
a substrate comprising a first surface, a second surface opposite the first surface, a first chamfered surface extending from a side of the first surface, a second chamfered surface extending from a side of the second surface, and a first side surface connecting the first chamfered surface and the second chamfered surface;
a plurality of subpixels on the first surface of the substrate and respectively comprising inorganic light emitting elements configured to emit light;
a side wiring on the first surface, the first chamfered surface, the first side surface, the second chamfered surface, and the second surface of the substrate; and
a circuit board on the second surface of the substrate and electrically connected to the side wiring,
wherein the side wiring comprises a first portion on the first surface of the substrate and a second portion on the first side surface of the substrate, and
wherein the side wiring comprises metal particles and a packing density of the metal particles of the first portion is higher than a packing density of the metal particles of the second portion.

2. The display device of claim 1, wherein the side wiring further comprises a third portion on the first chamfered surface of the substrate, and the packing density of the metal particles of the first portion is higher than a packing density of the metal particles of the third portion.

3. The display device of claim 2, wherein the packing density of the metal particles of the second portion is higher than the packing density of the metal particles of the third portion.

4. The display device of claim 1, wherein the side wiring further comprises a fourth portion on the second surface of the substrate, and a packing density of the metal particles of the fourth portion is higher than the packing density of the metal particles of the second portion.

5. The display device of claim 4, wherein the side wiring further comprises a fifth portion provided on the second chamfered surface of the substrate, and the packing density of the metal particles of the fourth portion is higher than a packing density of the metal particles of the fifth portion.

6. The display device of claim 5, wherein the packing density of the metal particles of the second portion is higher than the packing density of the metal particles of the fifth portion.

7. The display device of claim 1, wherein the side wiring further comprises a third portion on the first chamfered surface of the substrate, and a thickness of the first portion of the side wiring is greater than a thickness of the third portion of the side wiring.

8. The display device of claim 7, wherein a thickness of the second portion of the side wiring is greater than the thickness of the third portion of the side wiring.

9. A tiled display device comprising:
a first display device and a second display device; and
a seam between the first display device and the second display device, the seam configured to couple the first display device to the second display device,
wherein each of the first display device and the second display device comprises:
a substrate comprising a first surface, a second surface opposite the first surface, a first chamfered surface extending from a side of the first surface, a second chamfered surface extending from a side of the second surface, and a first side surface connecting the first chamfered surface and the second chamfered surface;
a plurality of subpixels on the first surface of the substrate and respectively comprising inorganic light emitting elements configured to emit light;
a side wiring on the first surface, the first chamfered surface, the first side surface, the second chamfered surface, and the second surface of the substrate; and
a circuit board on the second surface of the substrate and electrically connected to the side wiring,
wherein the side wiring comprises a first portion on the first surface of the substrate and a second portion on the first side surface of the substrate, and
wherein the side wiring comprises metal particles and a packing density of the metal particles of the first portion is higher than a packing density of the metal particles of the second portion.

* * * * *